(12) United States Patent  
Kim et al.

(10) Patent No.: US 7,956,453 B1  
(45) Date of Patent: Jun. 7, 2011

(54) SEMICONDUCTOR PACKAGE WITH PATTERNING LAYER AND METHOD OF MAKING SAME

(75) Inventors: Do Hyeong Kim, Gunpo-si (KR); Bong Chan Kim, Seongnam-si (KR); Yoon Joo Kim, Nowon-gu (KR); Ji Young Chung, Gunpo-si (KR)

(73) Assignee: Amkor Technology, Inc., Chandler, AZ (US)

( * ) Notice: Subject to any disclaimer, the term of this patent is extended or adjusted under 35 U.S.C. 154(b) by 18 days.

(21) Appl. No.: 12/015,428

(22) Filed: Jan. 16, 2008

(51) Int. Cl.  
*H01L 23/48* (2006.01)  
*H01L 23/04* (2006.01)

(52) U.S. Cl. ........ 257/692; 257/698; 257/773; 257/693; 257/E23.01; 257/E23.011

(58) Field of Classification Search .................. 257/738, 257/692, 693, 698, 784, 774, E23.011, E23.01, 257/773, E23.079  
See application file for complete search history.

(56) References Cited

U.S. PATENT DOCUMENTS

| | | | |
|---|---|---|---|
| 2,596,993 A | 5/1952 | Gookin | |
| 3,435,815 A | 4/1969 | Forcier | |
| 3,734,660 A | 5/1973 | Davies et al. | |
| 3,838,984 A | 10/1974 | Crane et al. | |
| 4,054,238 A | 10/1977 | Lloyd et al. | |
| 4,189,342 A | 2/1980 | Kock | |
| 4,258,381 A | 3/1981 | Inaba | |
| 4,289,922 A | 9/1981 | Devlin | |
| 4,301,464 A | 11/1981 | Otsuki et al. | |
| 4,332,537 A | 6/1982 | Slepcevic | |
| 4,417,266 A | 11/1983 | Grabbe | |
| 4,451,224 A | 5/1984 | Harding | |
| 4,530,152 A | 7/1985 | Roche et al. | |
| 4,541,003 A | 9/1985 | Otsuka et al. | |
| 4,646,710 A | 3/1987 | Schmid et al. | |
| 4,707,724 A | 11/1987 | Suzuki et al. | |

(Continued)

FOREIGN PATENT DOCUMENTS

DE 19734794 A1 8/1997

(Continued)

OTHER PUBLICATIONS

National Semiconductor Corporation, "Leadless Leadframe Package," Informational Pamphlet from webpage, 21 pages, Oct. 2002, www.national.com.

(Continued)

*Primary Examiner* — Wael M Fahmy  
*Assistant Examiner* — Sarah K Salerno  
(74) *Attorney, Agent, or Firm* — Stetina Brunda Garred & Brucker

(57) ABSTRACT

In accordance with the present invention, there is provided multiple embodiments of a semiconductor package including one or more semiconductor dies which are electrically connected to an underlying substrate through the use of a conductive pattern which is at least partially embedded in a patterning layer of the package. In a basic embodiment of the present invention, the semiconductor package comprises a substrate having a conductive pattern disposed thereon. Electrically connected to the conductive pattern of the substrate is at least one semiconductor die. The semiconductor die and the substrate are at least partially encapsulated by a patterning layer. Embedded in the patterning layer is a wiring pattern which electrically connects the semiconductor die to the conductive pattern. A portion of the wiring pattern is exposed in the patterning layer.

19 Claims, 22 Drawing Sheets

U.S. PATENT DOCUMENTS

| | | |
|---|---|---|
| 4,727,633 A | 3/1988 | Herrick |
| 4,737,839 A | 4/1988 | Burt |
| 4,756,080 A | 7/1988 | Thorpe, Jr. et al. |
| 4,812,896 A | 3/1989 | Rothgery et al. |
| 4,862,245 A | 8/1989 | Pashby et al. |
| 4,862,246 A | 8/1989 | Masuda et al. |
| 4,907,067 A | 3/1990 | Derryberry |
| 4,920,074 A | 4/1990 | Shimizu et al. |
| 4,935,803 A | 6/1990 | Kalfus et al. |
| 4,942,454 A | 7/1990 | Mori et al. |
| 4,987,475 A | 1/1991 | Sclesinger et al. |
| 5,018,003 A | 5/1991 | Yasunaga et al. |
| 5,029,386 A | 7/1991 | Chao et al. |
| 5,041,902 A | 8/1991 | McShane |
| 5,057,900 A | 10/1991 | Yamazaki |
| 5,059,379 A | 10/1991 | Tsutsumi et al. |
| 5,065,223 A | 11/1991 | Matsuki et al. |
| 5,070,039 A | 12/1991 | Johnson et al. |
| 5,087,961 A | 2/1992 | Long et al. |
| 5,091,341 A | 2/1992 | Asada et al. |
| 5,096,852 A | 3/1992 | Hobson et al. |
| 5,118,298 A | 6/1992 | Murphy |
| 5,122,860 A | 6/1992 | Kichuchi et al. |
| 5,134,773 A | 8/1992 | LeMaire et al. |
| 5,151,039 A | 9/1992 | Murphy |
| 5,157,475 A | 10/1992 | Yamaguchi |
| 5,157,480 A | 10/1992 | McShane et al. |
| 5,168,368 A | 12/1992 | Gow, III et al. |
| 5,172,213 A | 12/1992 | Zimmerman |
| 5,172,214 A | 12/1992 | Casto |
| 5,175,060 A | 12/1992 | Enomoto et al. |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,221,642 A | 6/1993 | Burns |
| 5,250,841 A | 10/1993 | Sloan et al. |
| 5,252,853 A | 10/1993 | Michii |
| 5,258,094 A | 11/1993 | Furui et al. |
| 5,266,834 A | 11/1993 | Nishi et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,279,029 A | 1/1994 | Burns |
| 5,281,849 A | 1/1994 | Singh Deo et al. |
| 5,285,352 A | 2/1994 | Pastore et al. |
| 5,294,897 A | 3/1994 | Notani et al. |
| 5,327,008 A | 7/1994 | Djennas et al. |
| 5,332,864 A | 7/1994 | Liang et al. |
| 5,335,771 A | 8/1994 | Murphy |
| 5,336,931 A | 8/1994 | Juskey et al. |
| 5,343,076 A | 8/1994 | Katayama et al. |
| 5,358,905 A | 10/1994 | Chiu |
| 5,365,106 A | 11/1994 | Watanabe |
| 5,381,042 A | 1/1995 | Lerner et al. |
| 5,391,439 A | 2/1995 | Tomita et al. |
| 5,406,124 A | 4/1995 | Morita et al. |
| 5,410,180 A | 4/1995 | Fujii et al. |
| 5,414,299 A | 5/1995 | Wang et al. |
| 5,417,905 A | 5/1995 | LeMaire et al. |
| 5,424,576 A | 6/1995 | Djennas et al. |
| 5,428,248 A | 6/1995 | Cha |
| 5,434,057 A | 7/1995 | Bindra et al. |
| 5,444,301 A | 8/1995 | Song et al. |
| 5,452,511 A | 9/1995 | Chang |
| 5,454,905 A | 10/1995 | Fogelson |
| 5,467,032 A | 11/1995 | Lee |
| 5,474,958 A | 12/1995 | Djennas et al. |
| 5,484,274 A | 1/1996 | Neu |
| 5,493,151 A | 2/1996 | Asada et al. |
| 5,508,556 A | 4/1996 | Lin |
| 5,517,056 A | 5/1996 | Bigler et al. |
| 5,521,429 A | 5/1996 | Aono et al. |
| 5,528,076 A | 6/1996 | Pavio |
| 5,534,467 A | 7/1996 | Rostoker |
| 5,539,251 A | 7/1996 | Iverson et al. |
| 5,543,657 A | 8/1996 | Diffenderfer et al. |
| 5,544,412 A | 8/1996 | Romero et al. |
| 5,545,923 A | 8/1996 | Barber |
| 5,581,122 A | 12/1996 | Chao et al. |
| 5,592,019 A | 1/1997 | Ueda et al. |
| 5,592,025 A | 1/1997 | Clark et al. |
| 5,594,274 A | 1/1997 | Suetaki |
| 5,595,934 A | 1/1997 | Kim |
| 5,604,376 A | 2/1997 | Hamburgen et al. |
| 5,608,265 A | 3/1997 | Kitano et al. |
| 5,608,267 A | 3/1997 | Mahulikar et al. |
| 5,625,222 A | 4/1997 | Yoneda et al. |
| 5,633,528 A | 5/1997 | Abbott et al. |
| 5,637,922 A | 6/1997 | Fillion et al. |
| 5,639,990 A | 6/1997 | Nishihara et al. |
| 5,640,047 A | 6/1997 | Nakashima |
| 5,641,997 A | 6/1997 | Ohta et al. |
| 5,643,433 A | 7/1997 | Fukase et al. |
| 5,644,169 A | 7/1997 | Chun |
| 5,646,831 A | 7/1997 | Manteghi |
| 5,650,663 A | 7/1997 | Parthasaranthi |
| 5,661,088 A | 8/1997 | Tessier et al. |
| 5,665,996 A | 9/1997 | Williams et al. |
| 5,673,479 A | 10/1997 | Hawthorne |
| 5,683,806 A | 11/1997 | Sakumoto et al. |
| 5,683,943 A | 11/1997 | Yamada |
| 5,689,135 A | 11/1997 | Ball |
| 5,696,666 A | 12/1997 | Miles et al. |
| 5,701,034 A | 12/1997 | Marrs |
| 5,703,407 A | 12/1997 | Hori |
| 5,710,064 A | 1/1998 | Song et al. |
| 5,723,899 A | 3/1998 | Shin |
| 5,724,233 A | 3/1998 | Honda et al. |
| 5,726,493 A | 3/1998 | Yamashita |
| 5,736,432 A | 4/1998 | Mackessy |
| 5,745,984 A | 5/1998 | Cole, Jr. et al. |
| 5,753,532 A | 5/1998 | Sim |
| 5,753,977 A | 5/1998 | Kusaka et al. |
| 5,766,972 A | 6/1998 | Takahashi et al. |
| 5,770,888 A | 6/1998 | Song et al. |
| 5,776,798 A | 7/1998 | Quan et al. |
| 5,783,861 A | 7/1998 | Son |
| 5,801,440 A | 9/1998 | Chu et al. |
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davies et al. |
| 5,817,540 A | 10/1998 | Wark |
| 5,818,105 A | 10/1998 | Kouda |
| 5,821,457 A | 10/1998 | Mosley et al. |
| 5,821,615 A | 10/1998 | Lee |
| 5,834,830 A | 11/1998 | Cho |
| 5,835,988 A | 11/1998 | Ishii |
| 5,844,306 A | 12/1998 | Fujita et al. |
| 5,854,512 A | 12/1998 | Manteghi |
| 5,856,911 A | 1/1999 | Riley |
| 5,859,471 A | 1/1999 | Kuraishi et al. |
| 5,866,939 A | 2/1999 | Shin et al. |
| 5,866,942 A | 2/1999 | Suzuki et al. |
| 5,871,782 A | 2/1999 | Choi |
| 5,874,784 A | 2/1999 | Aoki et al. |
| 5,877,043 A | 3/1999 | Alcoe et al. |
| 5,886,397 A | 3/1999 | Ewer |
| 5,973,935 A | 10/1999 | Schoenfeld et al. |
| 5,977,630 A | 11/1999 | Woodworth et al. |
| RE36,773 E | 7/2000 | Nomi et al. |
| 6,107,679 A | 8/2000 | Noguchi |
| 6,143,981 A | 11/2000 | Glenn |
| 6,166,430 A | 12/2000 | Yamaguchi |
| 6,169,329 B1 | 1/2001 | Farnworth et al. |
| 6,177,718 B1 | 1/2001 | Kozono |
| 6,181,002 B1 | 1/2001 | Juso et al. |
| 6,184,465 B1 | 2/2001 | Corisis |
| 6,184,573 B1 | 2/2001 | Pu |
| 6,194,777 B1 | 2/2001 | Abbott et al. |
| 6,197,615 B1 | 3/2001 | Song et al. |
| 6,198,171 B1 | 3/2001 | Huang et al. |
| 6,201,186 B1 | 3/2001 | Daniels et al. |
| 6,201,292 B1 | 3/2001 | Yagi et al. |
| 6,204,554 B1 | 3/2001 | Ewer et al. |

| | | |
|---|---|---|
| 6,208,020 B1 | 3/2001 | Minamio et al. |
| 6,208,021 B1 | 3/2001 | Ohuchi et al. |
| 6,208,023 B1 | 3/2001 | Nakayama et al. |
| 6,211,462 B1 | 4/2001 | Carter, Jr. et al. |
| 6,218,731 B1 | 4/2001 | Huang et al. |
| 6,222,258 B1 | 4/2001 | Asano et al. |
| 6,222,259 B1 | 4/2001 | Park et al. |
| 6,225,146 B1 | 5/2001 | Yamaguchi et al. |
| 6,229,200 B1 | 5/2001 | McClellan et al. |
| 6,229,205 B1 | 5/2001 | Jeong et al. |
| 6,239,367 B1 | 5/2001 | Hsuan et al. |
| 6,239,384 B1 | 5/2001 | Smith et al. |
| 6,242,281 B1 | 6/2001 | McClellan et al. |
| 6,256,200 B1 | 7/2001 | Lam et al. |
| 6,258,629 B1 | 7/2001 | Niones et al. |
| 6,281,566 B1 | 8/2001 | Magni |
| 6,281,568 B1 | 8/2001 | Glenn et al. |
| 6,282,094 B1 | 8/2001 | Lo et al. |
| 6,282,095 B1 | 8/2001 | Houghton et al. |
| 6,285,075 B1 | 9/2001 | Combs et al. |
| 6,291,271 B1 | 9/2001 | Lee et al. |
| 6,291,273 B1 | 9/2001 | Miyaki et al. |
| 6,294,100 B1 | 9/2001 | Fan et al. |
| 6,294,830 B1 | 9/2001 | Fjelstad |
| 6,295,977 B1 | 10/2001 | Ripper et al. |
| 6,297,548 B1 | 10/2001 | Moden et al. |
| 6,303,984 B1 | 10/2001 | Corisis |
| 6,303,997 B1 | 10/2001 | Lee |
| 6,307,272 B1 | 10/2001 | Takahashi et al. |
| 6,309,909 B1 | 10/2001 | Ohgiyama |
| 6,316,822 B1 | 11/2001 | Venkateshwaran et al. |
| 6,316,838 B1 | 11/2001 | Ozawa et al. |
| 6,323,550 B1 | 11/2001 | Martin et al. |
| 6,326,243 B1 | 12/2001 | Suzuya et al. |
| 6,326,244 B1 * | 12/2001 | Brooks et al. ................ 438/124 |
| 6,326,678 B1 | 12/2001 | Karmezos et al. |
| 6,335,564 B1 | 1/2002 | Pour |
| 6,337,510 B1 | 1/2002 | Chun-Jen et al. |
| 6,339,255 B1 | 1/2002 | Shin |
| 6,348,726 B1 | 2/2002 | Bayan et al. |
| 6,355,502 B1 | 3/2002 | Kang et al. |
| 6,359,221 B1 | 3/2002 | Yamada et al. |
| 6,362,525 B1 | 3/2002 | Rahim |
| 6,369,447 B2 | 4/2002 | Mori |
| 6,369,454 B1 | 4/2002 | Chung |
| 6,373,127 B1 | 4/2002 | Baudouin et al. |
| 6,377,464 B1 | 4/2002 | Hashemi et al. |
| 6,380,048 B1 | 4/2002 | Boon et al. |
| 6,384,472 B1 | 5/2002 | Huang |
| 6,388,336 B1 | 5/2002 | Venkateshwaran et al. |
| 6,395,578 B1 | 5/2002 | Shin et al. |
| 6,399,415 B1 | 6/2002 | Bayan et al. |
| 6,400,004 B1 | 6/2002 | Fan et al. |
| 6,410,979 B2 | 6/2002 | Abe |
| 6,414,385 B1 | 7/2002 | Huang et al. |
| 6,420,779 B1 | 7/2002 | Sharma et al. |
| 6,421,013 B1 | 7/2002 | Chung |
| 6,429,508 B1 | 8/2002 | Gang |
| 6,437,429 B1 | 8/2002 | Su et al. |
| 6,444,499 B1 | 9/2002 | Swiss et al. |
| 6,448,633 B1 | 9/2002 | Yee et al. |
| 6,452,279 B2 | 9/2002 | Shimoda |
| 6,459,148 B1 | 10/2002 | Chun-Jen et al. |
| 6,464,121 B2 | 10/2002 | Reijnders |
| 6,465,883 B2 | 10/2002 | Oloffsson |
| 6,472,735 B2 | 10/2002 | Isaak |
| 6,475,646 B2 | 11/2002 | Park et al. |
| 6,476,469 B2 | 11/2002 | Huang et al. |
| 6,476,474 B1 | 11/2002 | Hung |
| 6,482,680 B1 | 11/2002 | Khor et al. |
| 6,483,178 B1 | 11/2002 | Chuang |
| 6,492,718 B2 | 12/2002 | Ohmori et al. |
| 6,498,099 B1 | 12/2002 | McClellan et al. |
| 6,498,392 B2 | 12/2002 | Azuma |
| 6,507,096 B2 | 1/2003 | Gang |
| 6,507,120 B2 | 1/2003 | Lo et al. |
| 6,518,089 B2 | 2/2003 | Coyle |
| 6,525,942 B2 | 2/2003 | Huang et al. |
| 6,534,849 B1 | 3/2003 | Gang |
| 6,545,332 B2 | 4/2003 | Huang |
| 6,545,345 B1 | 4/2003 | Glenn et al. |
| 6,552,421 B2 | 4/2003 | Kishimoto et al. |
| 6,559,525 B2 | 5/2003 | Huang |
| 6,566,168 B2 | 5/2003 | Gang |
| 6,580,161 B2 | 6/2003 | Kobayakawa |
| 6,583,503 B2 | 6/2003 | Akram et al. |
| 6,603,196 B2 | 8/2003 | Lee et al. |
| 6,624,005 B1 | 9/2003 | DiCaprio et al. |
| 6,646,339 B1 | 11/2003 | Ku |
| 6,667,546 B2 | 12/2003 | Huang et al. |
| 6,677,663 B1 | 1/2004 | Ku et al. |
| 6,686,649 B1 | 2/2004 | Matthews et al. |
| 6,696,752 B2 | 2/2004 | Su et al. |
| 6,700,189 B2 | 3/2004 | Shibata |
| 6,713,375 B2 | 3/2004 | Shenoy |
| 6,757,178 B2 | 6/2004 | Okabe et al. |
| 6,800,936 B2 | 10/2004 | Kosemura et al. |
| 6,812,552 B2 | 11/2004 | Islam et al. |
| 6,858,919 B2 | 2/2005 | Seo et al. |
| 6,867,492 B2 | 3/2005 | Auburger et al. |
| 6,878,571 B2 | 4/2005 | Isaak et al. |
| 6,897,552 B2 | 5/2005 | Nakao |
| 6,900,530 B1 * | 5/2005 | Tsai ............................ 257/686 |
| 6,927,478 B2 | 8/2005 | Paek |
| 7,002,805 B2 | 2/2006 | Lee et al. |
| 7,005,327 B2 | 2/2006 | Kung et al. |
| 7,015,571 B2 | 3/2006 | Chang et al. |
| 7,053,469 B2 | 5/2006 | Koh et al. |
| 7,102,209 B1 | 9/2006 | Bayan et al. |
| 7,122,901 B2 * | 10/2006 | Sunohara et al. ............. 257/758 |
| 7,185,426 B1 | 3/2007 | Hiner et al. |
| 7,211,471 B1 | 5/2007 | Foster |
| 7,245,007 B1 | 7/2007 | Foster |
| 7,253,503 B1 | 8/2007 | Fusaro et al. |
| 7,847,384 B2 * | 12/2010 | Kobayashi et al. ........... 257/686 |
| 2001/0008305 A1 | 7/2001 | McClellan et al. |
| 2001/0014538 A1 | 8/2001 | Kwan et al. |
| 2002/0011654 A1 | 1/2002 | Kimura |
| 2002/0024122 A1 | 2/2002 | Jung et al. |
| 2002/0027297 A1 | 3/2002 | Ikenaga et al. |
| 2002/0038873 A1 | 4/2002 | Hiyoshi |
| 2002/0072147 A1 | 6/2002 | Sayanagi et al. |
| 2002/0111009 A1 | 8/2002 | Huang et al. |
| 2002/0140061 A1 | 10/2002 | Lee |
| 2002/0140068 A1 | 10/2002 | Lee et al. |
| 2002/0140081 A1 | 10/2002 | Chou et al. |
| 2002/0158318 A1 | 10/2002 | Chen |
| 2002/0163015 A1 | 11/2002 | Lee et al. |
| 2002/0167060 A1 | 11/2002 | Buijsman et al. |
| 2003/0006055 A1 | 1/2003 | Chien-Hung et al. |
| 2003/0030131 A1 | 2/2003 | Lee et al. |
| 2003/0059644 A1 | 3/2003 | Datta et al. |
| 2003/0064548 A1 | 4/2003 | Isaak |
| 2003/0073265 A1 | 4/2003 | Hu et al. |
| 2003/0102537 A1 | 6/2003 | McLellan et al. |
| 2003/0164554 A1 | 9/2003 | Fee et al. |
| 2003/0168719 A1 | 9/2003 | Cheng et al. |
| 2003/0198032 A1 | 10/2003 | Collander et al. |
| 2004/0027788 A1 | 2/2004 | Chiu et al. |
| 2004/0056277 A1 | 3/2004 | Karnezos |
| 2004/0061212 A1 | 4/2004 | Karnezos |
| 2004/0061213 A1 | 4/2004 | Karnezos |
| 2004/0063242 A1 | 4/2004 | Karnezos |
| 2004/0063246 A1 | 4/2004 | Karnezos |
| 2004/0065963 A1 | 4/2004 | Karnezos et al. |
| 2004/0080025 A1 | 4/2004 | Kasahara et al. |
| 2004/0089926 A1 | 5/2004 | Hsu et al. |
| 2004/0164387 A1 | 8/2004 | Ikenaga et al. |
| 2004/0253803 A1 | 12/2004 | Tomono et al. |
| 2006/0019484 A1 * | 1/2006 | Chen et al. ................... 438/618 |
| 2006/0087020 A1 | 4/2006 | Hirano et al. |
| 2006/0125082 A1 * | 6/2006 | Wakabayashi et al. ........ 257/698 |
| 2006/0157843 A1 | 7/2006 | Hwang |
| 2006/0231939 A1 | 10/2006 | Kawabata et al. |

FOREIGN PATENT DOCUMENTS

| | | |
|---|---|---|
| EP | 0393997 | 10/1990 |
| EP | 0459493 | 12/1991 |

| | | |
|---|---|---|
| EP | 0720225 | 3/1996 |
| EP | 0720234 | 3/1996 |
| EP | 0794572 A2 | 10/1997 |
| EP | 0844665 | 5/1998 |
| EP | 0936671 | 8/1999 |
| EP | 0989608 | 3/2000 |
| EP | 1032037 | 8/2000 |
| JP | 55163868 | 12/1980 |
| JP | 5745959 | 3/1982 |
| JP | 58160096 | 8/1983 |
| JP | 59208756 | 11/1984 |
| JP | 59227143 | 12/1984 |
| JP | 60010756 | 1/1985 |
| JP | 60116239 | 8/1985 |
| JP | 60195957 | 10/1985 |
| JP | 60231349 | 11/1985 |
| JP | 6139555 | 2/1986 |
| JP | 61248541 | 11/1986 |
| JP | 629639 | 1/1987 |
| JP | 6333854 | 2/1988 |
| JP | 63067762 | 3/1988 |
| JP | 63188964 | 8/1988 |
| JP | 63205935 | 8/1988 |
| JP | 63233555 | 9/1988 |
| JP | 63249345 | 10/1988 |
| JP | 63289951 | 11/1988 |
| JP | 63316470 | 12/1988 |
| JP | 64054749 | 3/1989 |
| JP | 1106456 | 4/1989 |
| JP | 1175250 | 7/1989 |
| JP | 1205544 | 8/1989 |
| JP | 1251747 | 10/1989 |
| JP | 2129948 | 5/1990 |
| JP | 369248 | 7/1991 |
| JP | 3177060 | 8/1991 |
| JP | 4098864 | 3/1992 |
| JP | 5129473 | 5/1993 |
| JP | 5166992 | 7/1993 |
| JP | 5283460 | 10/1993 |
| JP | 6061401 | 3/1994 |
| JP | 692076 | 4/1994 |
| JP | 6140563 | 5/1994 |
| JP | 6260532 | 9/1994 |
| JP | 7297344 | 11/1995 |
| JP | 7312405 | 11/1995 |
| JP | 8064364 | 3/1996 |
| JP | 8083877 | 3/1996 |
| JP | 8125066 | 5/1996 |
| JP | 964284 | 6/1996 |
| JP | 8222682 | 8/1996 |
| JP | 8306853 | 11/1996 |
| JP | 98205 | 1/1997 |
| JP | 98206 | 1/1997 |
| JP | 98207 | 1/1997 |
| JP | 992775 | 4/1997 |
| JP | 9260568 | 10/1997 |
| JP | 9293822 | 11/1997 |
| JP | 10022447 | 1/1998 |
| JP | 10199934 | 7/1998 |
| JP | 10256240 | 9/1998 |
| JP | 11307675 | 11/1999 |
| JP | 2000150765 | 5/2000 |
| JP | 20010600648 | 3/2001 |
| JP | 2002519848 | 7/2002 |
| JP | 200203497 | 8/2002 |
| KR | 941979 | 1/1994 |
| KR | 19940010938 | 5/1994 |
| KR | 19950018924 | 6/1995 |
| KR | 19950041844 | 11/1995 |
| KR | 19950044554 | 11/1995 |
| KR | 19950052621 | 12/1995 |
| KR | 1996074111 | 12/1996 |
| KR | 9772358 | 11/1997 |
| KR | 100220154 | 6/1999 |
| KR | 20000072714 | 12/2000 |
| KR | 20000086238 | 12/2000 |
| KR | 20020049944 | 6/2002 |
| WO | 9956316 | 11/1999 |
| WO | 9967821 | 12/1999 |

OTHER PUBLICATIONS

Vishay, "4 Milliohms in the So-8: Vishay Siliconix Sets New Record for Power MOSFET On-Resistance," Press Release from webpage, 3 pages, www.vishay.com/news/releases, Nov. 7, 2002.

Patrick Mannion, "MOSFETs Break out of the Shackles of Wire Bonding," Informational Packet, 5 pages, Electronic Design, Mar. 22, 1999 vol. 47, No. 6, www.elecdesign.com/1999/mar2299/ti/0322ti1.shtml.

* cited by examiner

SEMICONDUCTOR PACKAGE WITH PATTERNING LAYER AND METHOD OF MAKING SAME

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

1. Field of the Invention

The present invention relates generally to integrated circuit chip package technology and, more particularly, to a semiconductor package including one or more semiconductor dies which are electrically connected to an underlying substrate through the use of a conductive pattern which is at least partially embedded in a patterning layer of the package.

2. Description of the Related Art

Semiconductor dies are conventionally enclosed in plastic packages that provide protection from hostile environments and enable electrical interconnection between the semiconductor die and an underlying substrate such as a printed circuit board (PCB) or motherboard. The elements of such a package include a metal leadframe, an integrated circuit or semiconductor die, bonding material to attach the semiconductor die to the leadframe, bond wires which electrically connect pads on the semiconductor die to individual leads of the leadframe, and a hard plastic encapsulant material which covers the other components and forms the exterior of the semiconductor package commonly referred to as the package body.

The leadframe is the central supporting structure of such a package, and is typically fabricated by chemically etching or mechanically stamping a metal strip. A portion of the leadframe is internal to the package, i.e., completely surrounded by the plastic encapsulant or package body. Portions of the leads of the leadframe extend externally from the package body or are partially exposed therein for use in electrically connecting the package to another component. In certain semiconductor packages, a portion of the die attach pad or die pad of the leadframe also remains exposed within the package body. In other semiconductor packages, the metal leadframe is substituted with a laminate substrate to which the semiconductor die is mounted and which includes pads or terminals for mimicking the functionality of the leads and establishing electrical communication with another device.

Once the semiconductor dies have been produced and encapsulated in the semiconductor packages described above, they may be used in a wide variety of electronic devices. The variety of electronic devices utilizing semiconductor packages has grown dramatically in recent years. These devices include cellular phones, portable computers, etc. Each of these devices typically includes a printed circuit board on which a significant number of such semiconductor packages are secured to provide multiple electronic functions. These electronic devices are typically manufactured in reduced sizes and at reduced costs, which results in increased consumer demand. Accordingly, not only are semiconductor dies highly integrated, but also semiconductor packages are highly miniaturized with an increased level of package mounting density.

In currently known semiconductor packages, the electrical connection of the semiconductor die to the leadframe or the underlying substrate is most typically accomplished through the use of electrically conductive wires. As indicated above, these conductive wires are used to electrically connect pads on the semiconductor die to individual leads of the leadframe or the pads or terminals of the substrate. These conductive wires are usually made of gold due to its excellent reliability and electrical conductivity. As also indicated above, these conductive wires are typically covered by the hard plastic encapsulant material which ultimately forms the package body of the semiconductor package. This encapsulant material is often an epoxy molding compound (EMC) which itself has excellent thermal property, electrical property, and a high level of formability, thus making such material well suited to protecting the semiconductor die and the conductive wires. However, one of the drawbacks to the use of the aforementioned conductive wires is that the structural design for manufacturing the semiconductor package is highly complicated, and detailed processing conditions are necessary for such manufacture. These complexities in the manufacturing process give rise to drastically increased manufacturing costs in relation to the semiconductor package.

In addition to the foregoing, even though semiconductor packages have been miniaturized, space on a printed circuit board remains limited and precious. Thus, there is an ongoing need to find semiconductor package designs which maximize the number of semiconductor packages that may be integrated into an electronic device, yet minimize the space needed to accommodate these semiconductor packages. One method to minimize space needed to accommodate the semiconductor packages is to stack the semiconductor packages, individual semiconductor dies, or other devices on top of each other, or to stack the semiconductor dies or other devices within the package body of a semiconductor package. However, even in those semiconductor packages including stacked semiconductor dies, electrically conductive wires are still typically used to electrically connect such semiconductor dies to the underlying substrate, thus giving rise to the same complexity and cost issues highlighted above. Therefore, a new solution is needed, such solution being provided by the present invention which is discussed in detail below.

BRIEF SUMMARY OF THE INVENTION

In accordance with the present invention, there is provided multiple embodiments of a semiconductor package including one or more semiconductor dies which are electrically connected to an underlying substrate through the use of a conductive pattern which is at least partially embedded in a patterning layer of the package. In a basic embodiment of the present invention, the semiconductor package comprises a substrate having a conductive pattern disposed thereon. Electrically connected to the conductive pattern of the substrate is at least one semiconductor die. The semiconductor die and the substrate are at least partially encapsulated by a patterning layer. Embedded in the patterning layer is a wiring pattern which electrically connects the semiconductor die to the conductive pattern. A portion of the wiring pattern is exposed in the patterning layer. In another embodiment of the present invention, a second semiconductor die is electrically connected to the conductive pattern of the substrate, with a second patterning layer at least partially encapsulating the second semiconductor die and the underlying first patterning layer. In this embodiment, a second wiring pattern is embedded in the second patterning layer to electrically connect the second semiconductor die to the conductive pattern of the substrate, with a portion of the second wiring pattern being exposed in the second patterning layer.

In yet another embodiment of the present invention, the semiconductor package comprises a substrate having a conductive pattern disposed thereon, and a first patterning layer which at least partially encapsulates the substrate. Embedded in the first patterning layer is a first wiring pattern which is electrically connected to the substrate. A portion of the first wiring pattern in exposed in the first patterning layer. Electrically connected to the first wiring pattern is a first semiconductor die. A second patterning layer at least partially encapsulates the first semiconductor die and the first patterning layer. A second wiring pattern is embedded in the second patterning layer and is electrically connected to the first semiconductor die, a portion of the second wiring pattern being exposed in the second patterning layer. A second semiconductor die is electrically connected to the second wiring pattern, with a third patterning layer at least partially encapsulating the second semiconductor die and the second patterning layer. Further in accordance with the present invention, there is provided methodologies for fabricating the semiconductor package of each embodiment disclosed herein.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1:
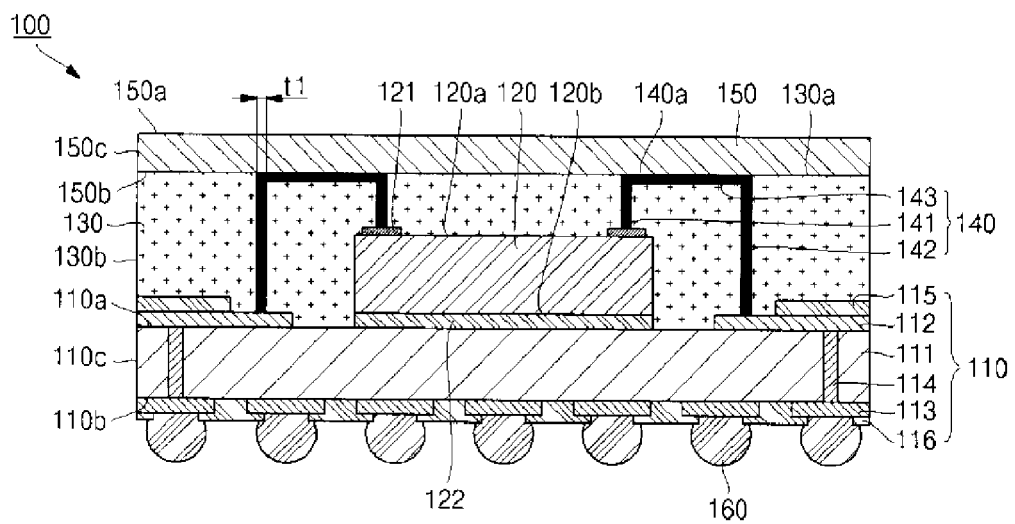
FIG. 1 is a cross-sectional view of a semiconductor package constructed in accordance with a first embodiment of the present invention.

Referring now to the drawings wherein the showings are for purposes of illustrating various embodiments of the present invention only, and not for purposes of limiting the same, FIG. 1 illustrates a semiconductor package 100 constructed in accordance with a first embodiment of the present invention. The semiconductor package 100 comprises a substrate 110. The substrate 110 comprises an insulative layer 111 which defines a generally planar first (top) surface 110a and an opposed, generally planar second (bottom) surface 110b. The insulative layer 111 further comprises a third (side) surface 110c which extends generally perpendicularly between the first and second surfaces 110a, 110b.

The substrate 110 further comprises a first electrically conductive pattern 112 which is formed on the first surface 110a, and a second electrically conductive pattern 113 which is formed on the second surface 110b. The first and second conductive patterns 112, 113 may each comprise various pads, traces, or combinations thereof. In the substrate 110, the first and second conductive patterns 112, 113 are electrically connected to each other in a prescribed pattern or arrangement through the use of conductive vias 114 which extend through the insulative layer 111 between the first and second surfaces 110a, 110b thereof in the manner shown in FIG. 1. The substrate 110 further preferably includes a first solder mask 115 which covers a predetermined region of the first conductive pattern 112, and a second solder mask 116 which covers a predetermined region of the second conductive pattern 113. The first and second solder masks 115, 116 are provided to prevent respective ones of the first and second conductive patterns 112, 113 from being oxidized or corroded when such first and second conductive patterns 112, 113 are exposed to the outside environment. Additionally, as is also seen in FIG. 1, it is contemplated that in the substrate 110, solder balls 160 will be electrically coupled to the second conductive pattern 113 in a prescribed arrangement, such solder balls 160 being used to transmit electrical signals from the semiconductor package 100 to an external device. The substrate 110 of the semiconductor package 100 may comprise a general, rigid printed circuit board, a flexible printed circuit board, or an equivalent thereto, the present invention not being limited to any particular material or combination of materials for the substrate 110.

The semiconductor package 100 further comprises a semiconductor die 120 which defines a generally planar first (top) surface 120a, and an opposed, generally planar second (bottom) surface 120b. Formed on the first surface 120a of the semiconductor die 120 is one or more bonding pads 121. The bonding pads 121 may be formed in a central region of the first surface 120a, or alternatively may be formed to extend in close proximity to the peripheral edge of the first surface 120a in the manner shown in FIG. 1. The second surface 120b of the semiconductor die 120 is attached to the first surface 110a of the insulative layer 111 by an adhesive layer 122 which is interposed therebetween. The adhesive layer 122 may comprise a general epoxy adhesive, a double-sided adhesive tape, a double-sided adhesive film or equivalents thereto, the present invention not being limited to any specific material for the adhesive layer 122.

The semiconductor package 100 of the present invention further comprises a patterning layer 130 which is formed to cover the semiconductor die 120, the exposed portion of the first surface 110a of the insulative layer 111, and all but the outer ends of the first conductive pattern 112 and first solder mask 115. The fully formed patterning layer 130 defines a generally planar first (top) surface 130a and a second (side) surface 130b which extends generally perpendicularly relative to the first surface 130a. In this regard, the second surface 130b of the patterning layer 130 extends in substantially coplanar relation to the third surface 110c of the insulative layer 111, and further extends in generally coplanar relation to the outer ends of the first and second conductive patterns 112, 113, as well as the outer ends of the first and second solder masks 115, 116. In the semiconductor package 100, the patterning layer 130 is used to protect the substrate 110, the semiconductor die 120 and a wiring pattern 140 (which will be described in more detail below) embedded in the patterning layer 130 from external impacts or oxidation. It is contemplated that the patterning layer 130 may be formed of a translucent material in order to check the position where the wiring pattern 140 is formed, though the transparency of the patterning layer 130 is not required in the semiconductor package 100. Additionally, the patterning layer 130 may be formed of a thermal resistant and non-conductive polymer or an equivalent material, the present invention not being limited to any specific material for the patterning layer 130.

As indicated above, the semiconductor package 100 further comprises a wiring pattern 140 which is embedded in the patterning layer 130. The wiring pattern 140 is provided to electrically couple or connect the semiconductor die 120 to the substrate 110. More particularly, the wiring pattern 140 is used to electrically connect the bonding pads 121 of the semiconductor die 120 to the first conductive pattern 112 of the substrate 110. The wiring pattern 140 is formed to penetrate the patterning layer 130, and includes a first via pattern 141 which is formed to extend from the first surface 130a of the patterning layer 130 to the bonding pads 121 in the manner best shown in FIG. 1. In addition to the first via pattern 141, the wiring pattern 140 includes a second via pattern 142 which is formed to extend from the first surface 130a of the patterning layer 130 to and into electrical communication with prescribed portions of the first conductive pattern 112. The wiring pattern 140 further includes a connection pattern 143 which is provided to connect the first via pattern 141 to the second via pattern 142 in a prescribed arrangement.

As is shown in FIG. 1, both the first and second via patterns 141, 142 extend generally perpendicularly relative to the first surface 130a, with the connection pattern 143 extending generally perpendicularly between the first and second via patterns 141, 142. As a result, a first (top) surface 140a of the connection pattern 143 is aligned with and extends in generally flush relation to the first surface 130a of the patterning layer 130. However, those of ordinary skill in the art will recognize that the wiring pattern 140 may be formed to have a variety of shapes or configurations according to the structure of the semiconductor package 100, the invention not being limited to the configuration of the wiring pattern 140 as shown in FIG. 1 and described above. Each segment of the wiring pattern 140 may also be formed to have a thickness t1 of approximately several to several tens of micrometers. Further, the wiring pattern 140 may be formed of a material such as gold, silver, copper, aluminum, or equivalent materials thereto, the present invention not being limited to any particular material for the wiring pattern 140. Moreover, though it is contemplated that the wiring pattern 140 will be formed to electrically communicate with each of the bonding pads 121 of the semiconductor die 120, communication with each such bonding pad 121 is not a requirement in the semiconductor package 100.

The semiconductor package 100 further comprises a protective layer 150 which covers the first surface 130a of the patterning layer 130 and thus the connection pattern 143 of the wiring pattern 140. The protective layer 150 defines a generally planar first (top) surface 150a, and an opposed, generally planar second (bottom) surface 150b which directly contacts the first surface 130a of the patterning layer 130 and the connection pattern 143 of the wiring pattern 140. The protective layer 150 further defines a third (side) surface 150c which extends generally perpendicularly between the first and second surfaces 150a, 150b, and further preferably extends in substantially flush relation to the second surface 130b of the patterning layer 130 in the manner shown in FIG. 1. The protective layer 150 is used to cover the patterning layer 130 and the connection pattern 143 of the wiring pattern 140 so as to prevent the patterning layer 130 and the wiring pattern 140 from being damaged or oxidized by external agents. It is contemplated that the protective layer 150 may be formed from a thermoresistant polymer film, such as a polyimide film, though the present invention is not intended to be limited to any particular material for the protective layer 150.

As indicated above, the solder balls 160 formed on the second conductive pattern 113 are used to electrically couple or connect the semiconductor package 100 to an external device and to facilitate the transmission and receipt of electrical signals to and from such external device. The solder balls 160 may each be formed from Sn/Pb, leadless Sn, or an equivalent material, the present invention not being limited to any particular material for the solder balls 160.

Figure 2:
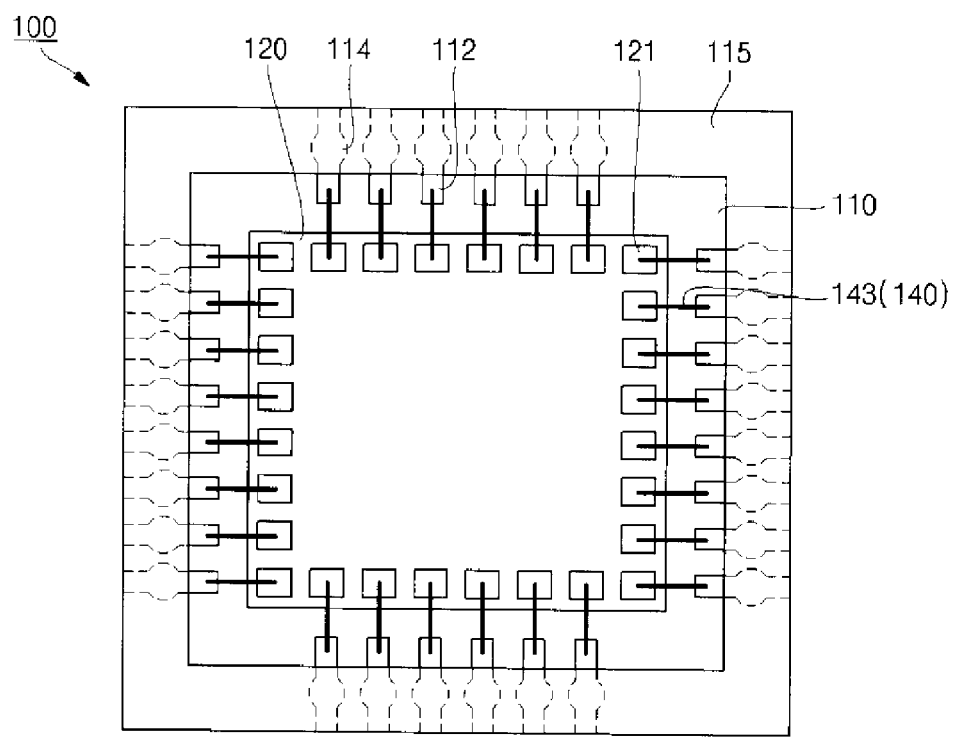
FIG. 2 is a top plan view of a semiconductor package of the first embodiment shown in FIG. 1 without the package body or protective layer for illustrative purposes.

FIG. 2 provides a top plan view of the semiconductor package 100 shown in FIG. 1, excluding the patterning layer 130 and protective layer 150 for illustrative purposes. As shown in FIG. 2, the first conductive pattern 112 is formed so as to extend along the third surface 110c of the insulative layer 111, with the wiring pattern 140 being formed to electrically connect each of the bonding pads 121 of the semiconductor die 120 to a corresponding, discreet portion of the first conductive pattern 112. As a result, the connection pattern 143 of the wiring pattern 140 comprises a plurality of substantially linear or straight segments, each of which extends between one of the bonding pads 121 and a respective one of the discreet portions of the first conductive pattern 112. However, as indicated above, it is contemplated that the wiring pattern 140 may be provided in any one of a multiplicity of different arrangements, depending on the structure of the semiconductor package 100. As is further shown in FIG. 2, the first solder mask 115 covers those portions of the first conductive pattern 112 to which the wiring pattern 140 is not connected.

Figure 5:
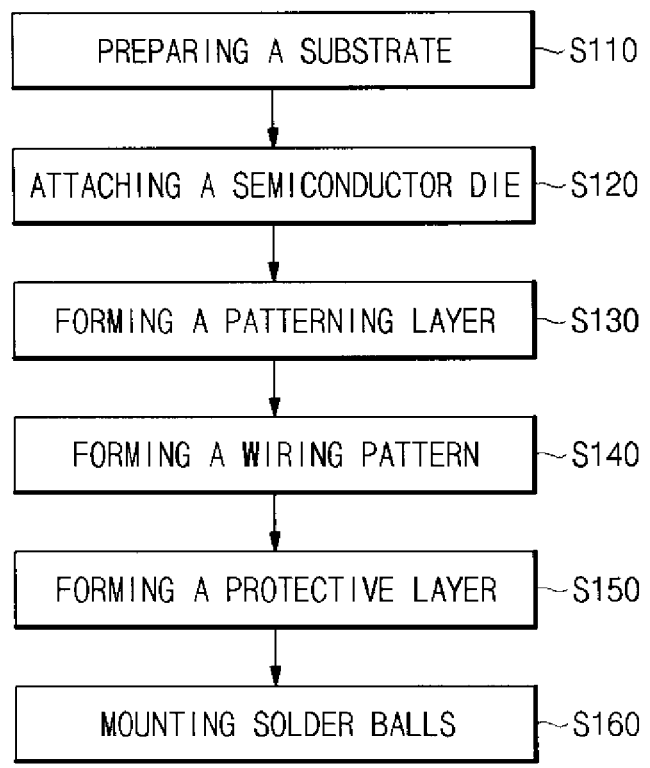
FIG. 5 is a flow chart describing an exemplary sequence of steps which may be used to facilitate the fabrication of the semiconductor package of the first embodiment shown in FIGS. 1 and 2.

Referring now to FIG. 5, there is provided a flow chart which describes an exemplary sequence of steps which may be used to facilitate the fabrication of the semiconductor package 100 shown in FIGS. 1 and 2. FIGS. 6A-6F depict an exemplary sequence of steps which may be used to facilitate the fabrication of the semiconductor package 100 in accordance with the flow chart shown in FIG. 5, and will be described in more detail below.

Figure 6A:
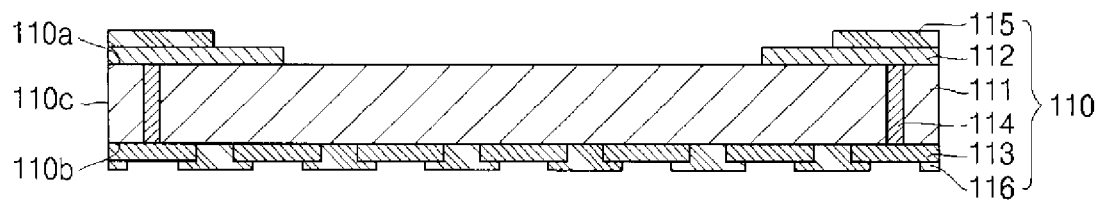
FIGS. 6A-6F illustrate an exemplary sequence of steps which may be used to facilitate the fabrication of the semiconductor package of the first embodiment shown in FIGS. 1 and 2.

In the initial step of the fabrication process shown in FIG. 6A, the substrate 110 is prepared (FIG. 5, step S110). In preparing the substrate 110, the first conductive pattern 112 is formed on the first surface 110a of the insulative layer 111, with the second conductive pattern 113 being formed on the second surface 110b thereof. The first and second conductive patterns 112, 113 may be formed through the use of a photolithography process, though the present invention is not intended to be limited to any particular method of forming the first and second conductive patterns 112, 113. The conductive vias 114 used to electrically connect the first and second conductive patterns 112, 113 to each other may be formed by the creation of via holes (not shown) in the insulative layer 111 through the use of a laser drill or an etching process, such via holes subsequently being filled or lined with a metal material so as to form the conductive vias 114. It is contemplated that the first and second conductive patterns 112, 113 and conductive vias 114 may each be formed of a metal material, such as copper, though the present invention is not intended to be limited to any specific materials in relation thereto. The above-described first and second solder masks 115, 116 which cover predetermined regions of respective ones of the first and second conductive patterns 112, 113 may be formed through a process of exposing and developing a thermosetting resin or a UV curable resin, though the present invention is also not intended to be limited to any particular method for forming the first and second solder masks 115, 116. As indicated above, the substrate 110 may comprise a general, rigid printed circuit board or an equivalent material. Additionally, though in FIG. 6A one insulative layer 111 is shown as being included in the substrate 110, a plurality of insulative layers 111 may be laminated to each other in a strip shape or in a matrix to form the substrate 110.

Figure 6B:
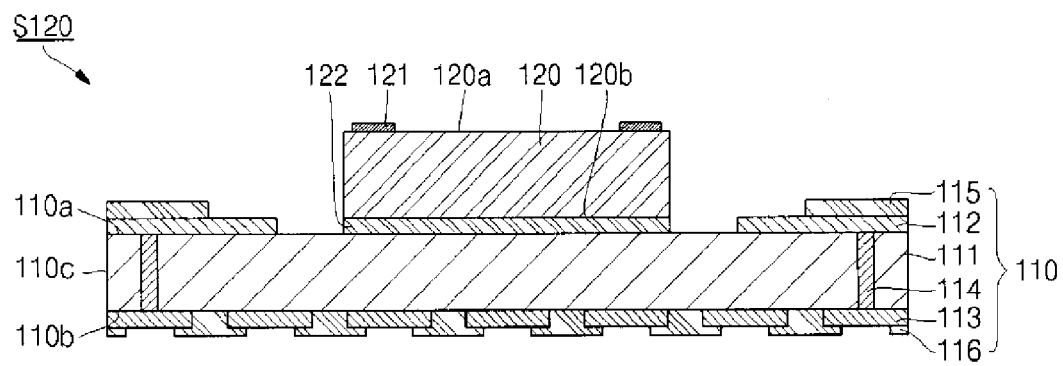

In the next step of the fabrication process for the semiconductor package 100 as shown in FIG. 6B, the semiconductor die 120 is attached to the first surface 110a of the insulative layer 111 (FIG. 5, step S120). As indicated above, the attachment of the semiconductor die 120 to the first surface 110a is preferably accomplished through the use of the adhesive layer 122. As also indicated above, the adhesive layer 122 is interposed and thus compressed between the second surface 120b of the semiconductor die 120 and the first surface 110a of the insulative layer 111 of the substrate 110.

Figure 6C:
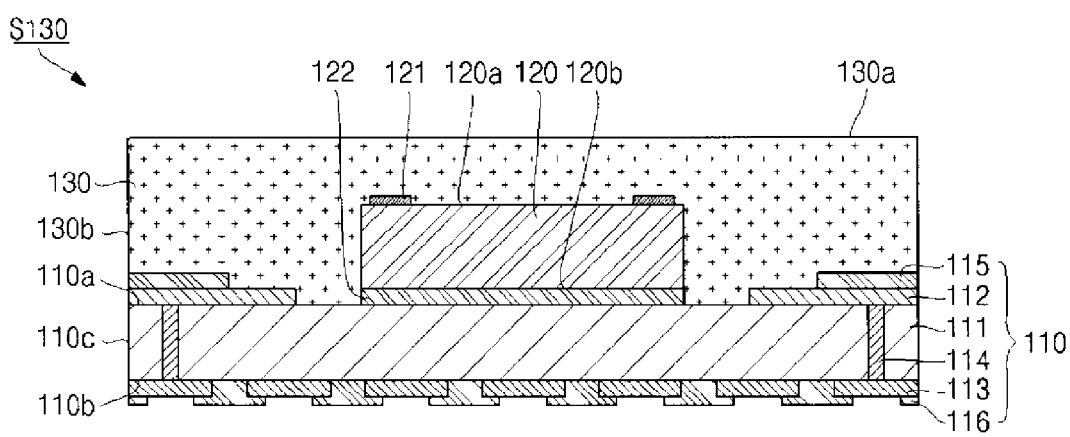

In the next step of the fabrication process for the semiconductor package 100 as shown in FIG. 6C, the patterning layer 130 is formed on the substrate 110 and semiconductor die 120 in the size and configuration described above in relation to FIG. 1 (FIG. 5, step S130). In this regard, the patterning layer 130 is formed by applying the material used to fabricate the same to the semiconductor die 120, the exposed portion of the first surface 110a of the insulative layer 111, the exposed portion of the first conductive pattern 112 other than for the outer end thereof, and the exposed portion of the first solder mask 115 other than for the outer end thereof. Subsequent to such application, the patterning layer 130 is hardened through the use of heat. The patterning layer 130 may be attached to the substrate 110 and semiconductor die 120 through the use of a semiconductor die bonding device or a specially developed device. In hardening the patterning layer 130, heat in the temperature range of about 130° C. to about 150° C. is applied to the patterning layer 130 in an oven.

Figure 6D:
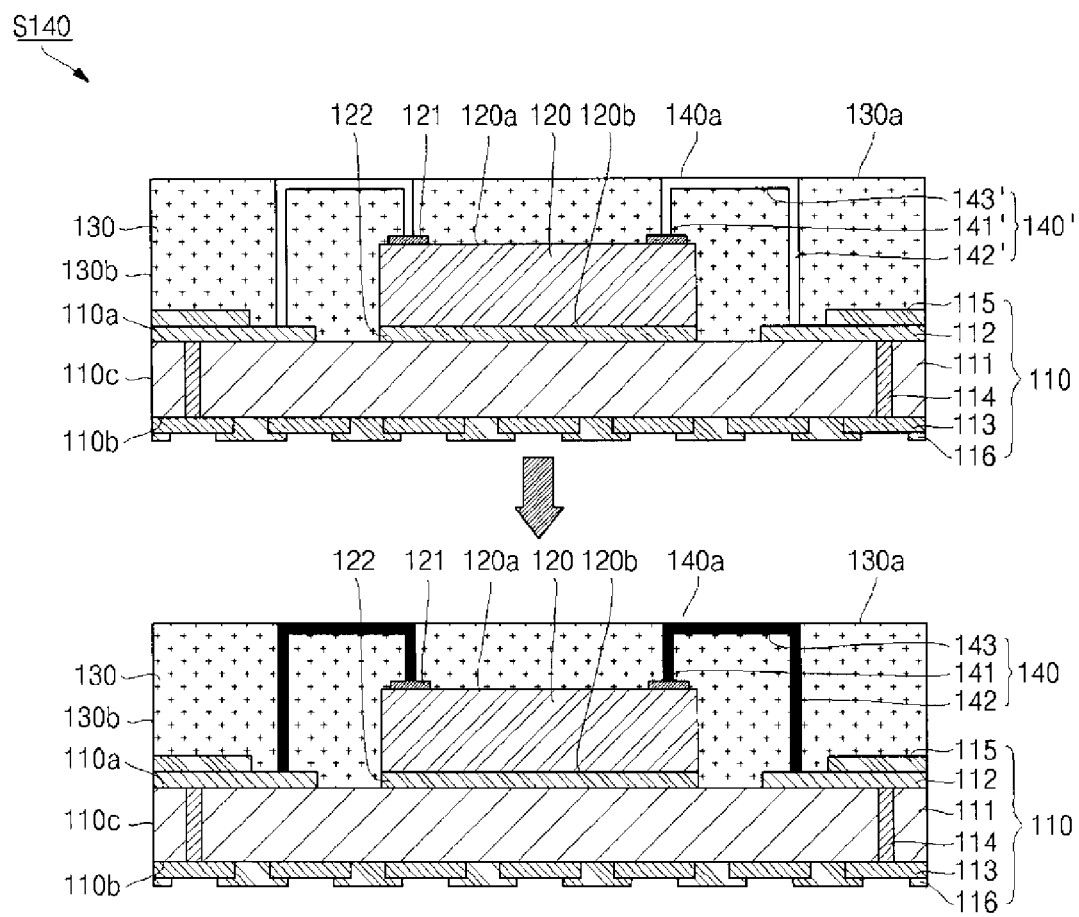

In the next step of the fabrication process for the semiconductor package 100 as shown in FIG. 6D, the above-described wiring pattern 140 is formed in the patterning layer 130 (FIG. 5, step S140). To facilitate the formation of the wiring pattern 140, first via patterning holes 141' are initially formed in the patterning layer 130, such first via patterning holes 141' extending generally perpendicularly between the first surface 130a of the patterning layer 130 and respective ones of the bonding pads 121 of the semiconductor die 120. Thereafter, second via patterning holes 142' are formed in the patterning layer 130. Each of the second via patterning holes 142' extends generally perpendicularly between the first surface 130a of the patterning layer 130 and a prescribed portion of the first conductive pattern 112. Subsequent to the formation of the first and second via patterning holes 141', 142', one or more connection patterning holes 143' are formed in the patterning layer 130, each patterning hole 143' extending generally perpendicularly between a corresponding pair of the first and second via patterning holes 141', 142' in the manner shown in FIG. 6D. Thus, each connection patterning hole 143' effectively connects each first via patterning hole 141' to a respective one the second via patterning holes 142'. Each connection patterning hole 143' is formed to be of a prescribed depth relative to the first surface 130a of the patterning layer 130.

As is further shown in FIG. 6D, each connection patterning hole 143' and the corresponding pair of first and second via patterning holes 141', 142' collectively define a patterning hole 140'. Each patterning hole 140' may be formed by milling using a micro-drilling or laser processing method, though the present invention is not intended to be limited to any specific method for forming any patterning hole 140' within the patterning layer 130. Subsequent to the formation of the patterning hole(s) 140', a conductive material in the form of ink or paste is injected into such patterning hole(s) 140', thus forming the first via pattern 141, the second via pattern 142 and the connection pattern 143 of the wiring pattern 140. In the semiconductor package 100, it is contemplated that the injected conductive material may include gold, silver, copper, aluminum or an equivalent material thereto, the present invention not being limited to any particular material for use in fabricating the wiring pattern 140. Additionally, the injection of the conductive material into the patterning hole(s) 140' to facilitate the formation of the wiring pattern 140 may be accomplished through the use of screen printing, writing, plating, or an equivalent technique, the present invention also not being limited to any particular injection method. After the conductive material is injected into the patterning hole(s) 140', the wiring pattern 140 is cured by the application of heat to the patterning layer 130 in a temperature range of about 150° C. to about 200° C.

Figure 6E:
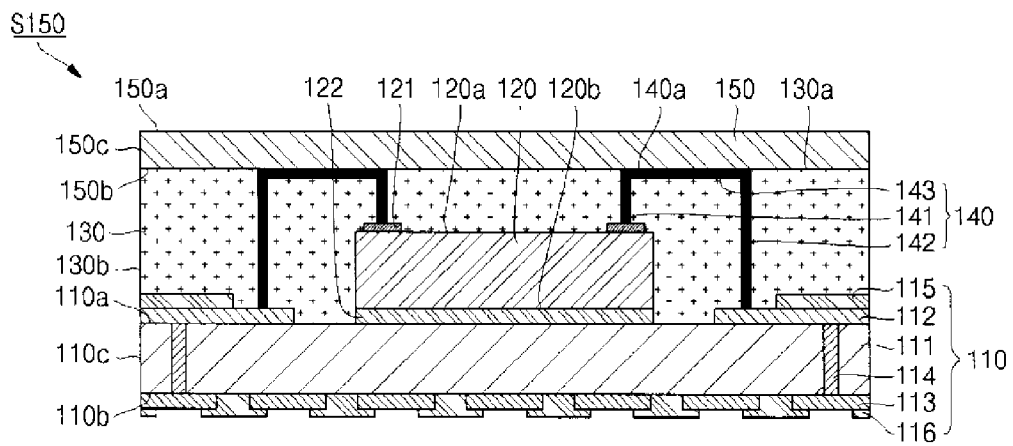

In the next step of the fabrication method for the semiconductor package 100 as shown in FIG. 6E, the protective layer 150 is formed on the patterning layer 130 so as to cover the exposed portion of the wiring pattern 140 (FIG. 5, step S150). It is contemplated that the protective layer 150 may be formed by the same method used to form the patterning layer 130. More particularly, the protective layer 150 may be formed by bonding the material used to form the same to the patterning layer 130 and the connection pattern 143 of the wiring pattern 140, and thereafter hardening such material. As indicated above, the protective layer 150 covers the first surface 130a of the patterning layer 130 and the exposed portion of the connection pattern 143 of the wiring pattern 140 so as to prevent the patterning layer 130 and the wiring pattern 140 from being damaged or oxidized by external agents.

Figure 6F:
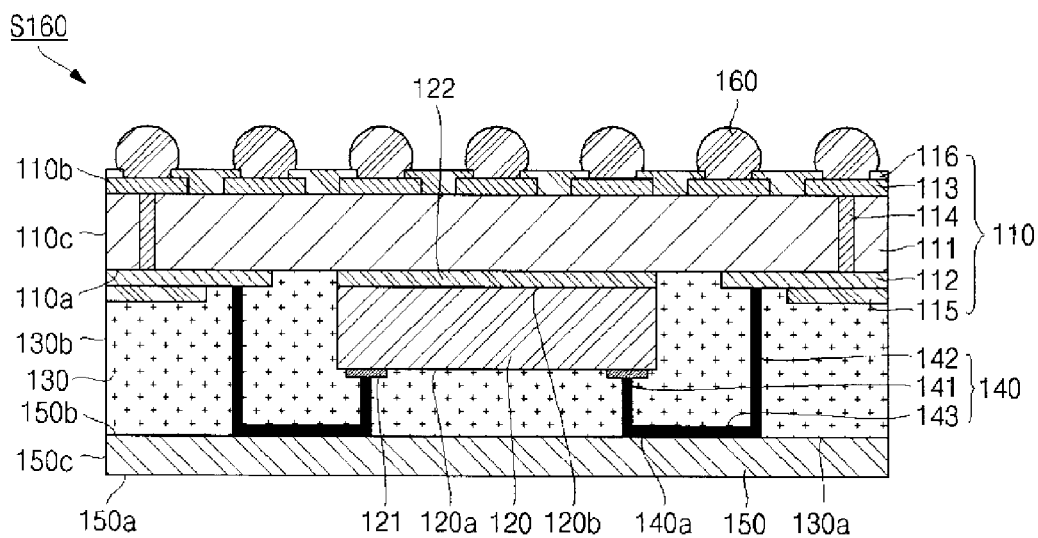

In the final step of the fabrication process for the semiconductor package 100 as shown in FIG. 6F, the solder balls 160 are mounted and electrically connected to the second conductive pattern 113 of the substrate 110 (FIG. 5, step S160). The mounting of the solder balls 160 to the second conductive pattern 113 includes the initial application of flux to exposed surface portions of the conductive pattern 113. Thereafter, the solder balls 160 are mounted to respective portions of the second conductive pattern 113 which have the flux applied thereto, with a reflowing and subsequent cooling procedure being implemented to complete the formation of the solder balls 160 and the electrical connection thereof to the second conductive pattern 113. The flux applied to the second conductive pattern 113 may have a viscosity so as to improve the adhesive property of the solder balls 160. Further, it is contemplated that the flux will be volatile so that it is mostly volatized in the reflowing step described above.

Figure 3:
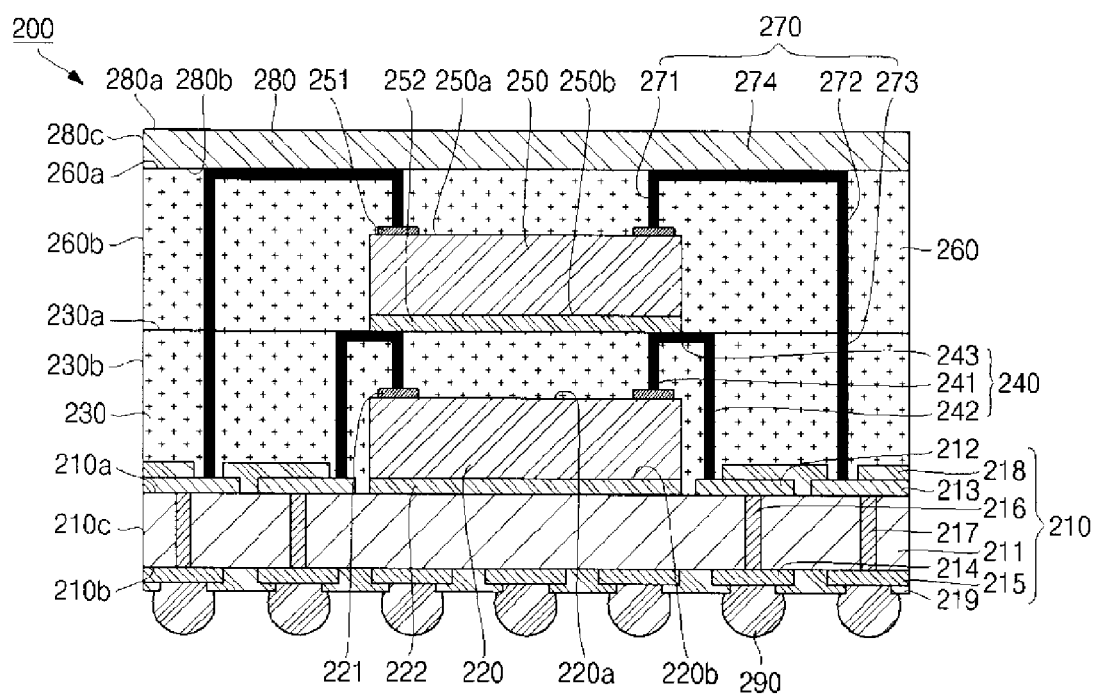
FIG. 3 is a cross-sectional view of a semiconductor package constructed in accordance with a second embodiment of the present invention.

Referring now to FIG. 3, there is shown a semiconductor package 200 constructed in accordance with second embodiment of the present invention. The semiconductor package 200 comprises a substrate 210. The substrate 210 comprises an insulative layer 211 which defines a generally planar first (top) surface 210a and an opposed, generally planar second (bottom) surface 210b. The insulative layer 211 further comprises a third (side) surface 210c which extends generally perpendicularly between the first and second surfaces 210a, 210b.

The substrate 210 further comprises a first electrically conductive pattern 212 and a second electrically conductive pattern 213 which are each formed on the first surface 210a of the insulative layer 211. Additionally, formed on the second surface 210b of the insulative layer 211 is a third electrically conductive pattern 214 and a fourth electrically conductive pattern 215. The first, second, third and fourth conductive patterns 212, 213, 214, 215 may each comprise various pads, traces, or combinations thereof. In the substrate 210, the first and third conductive patterns 212, 214 are electrically connected to each other in a prescribed pattern or arrangement through the use of conductive vias 216 which extend through the insulative layer 211 between the first and second surfaces 210a, 210b thereof in the manner shown in FIG. 3. Similarly, the second and fourth conductive patterns 213, 215 are electrically connected to each other in a prescribed pattern or arrangement through the use of conductive vias 217 which extend through the insulative layer 211 between the first and second surfaces 210a, 210b thereof in the manner also shown in FIG. 3.

The substrate 210 further preferably includes a first solder mask 218 which covers predetermined regions of the first and second conductive patterns 212, 213. The substrate also includes a second solder mask 219 which covers predetermined regions of the third and fourth conductive patterns 214, 215. The first and second solder masks 218, 219 are provided to prevent first, second, third and fourth conductive patterns 212, 213, 214, 215 from being oxidized or corroded when exposed to the outside environment. Additionally, as is also seen in FIG. 3, it is contemplated that in the substrate 210, solder balls 290 will be electrically coupled to the third and fourth conductive patterns 214, 215 in a prescribed arrangement, such solder balls 290 being used to transmit electrical signals from the semiconductor package 200 to an external device. The substrate 210 of the semiconductor package 200 may comprise a general, rigid printed circuit board, a flexible printed circuit board, or an equivalent thereto, the present invention not being limited to any particular material or combination of materials for the substrate 210.

The semiconductor package 200 further comprises a first (lower) semiconductor die 220 which defines a generally planar first (top) surface 220a, and an opposed, generally planar second (bottom) surface 220b. Formed on the first surface 220a of the semiconductor die 220 is one or more bonding pads 221. The bonding pads 221 may be formed in a central region of the first surface 220a, or alternatively may be formed to extend in close proximity to the peripheral edge of the first surface 220a in the manner shown in FIG. 3. The second surface 220b of the semiconductor die 220 is attached to the first surface 210a of the insulative layer 211 by an adhesive layer 222 which is interposed therebetween. The adhesive layer 222 may comprise a general epoxy adhesive, a double-sided adhesive tape, a double-sided adhesive film or equivalents thereto, the present invention not being limited to any specific material for the adhesive layer 222.

The semiconductor package 200 of the present invention further comprises a first patterning layer 230 which is formed to cover the semiconductor die 220, the exposed portion of the first surface 210a of the insulative layer 211, the first conductive pattern 212, and all but the outer ends of the second conductive pattern 213 and first solder mask 218. The fully formed first patterning layer 230 defines a generally planar first (top) surface 230a and a second (side) surface 230b which extends generally perpendicularly relative to the first surface 230a. In this regard, the second surface 230b of the first patterning layer 230 extends in substantially flush relation to the third surface 210c of the insulative layer 211, and further extends in generally coplanar relation to the outer ends of the second and fourth conductive patterns 213, 215, as well as the outer ends of the first and second solder masks 218, 219. In the semiconductor package 200, the first patterning layer 230 is used to protect the substrate 210, the first semiconductor die 220 and a first wiring pattern 240 (which will be described in more detail below) embedded in the first patterning layer 230 from external impacts or oxidation. It is contemplated that the first patterning layer 230 may be formed of a translucent material in order to check the position where the wiring pattern 240 is formed, though the transparency of the first patterning layer 230 is not required in the semiconductor package 200. Additionally, the first patterning layer 230 may be formed of a thermal resistant and non-conductive polymer or an equivalent material, the present invention not being limited to any specific material for the first patterning layer 230.

As indicated above, the semiconductor package 200 further comprises a first wiring pattern 240 which is embedded in the first patterning layer 230. The first wiring pattern 240 is provided to electrically couple or connect the first semiconductor die 220 to the substrate 210. More particularly, the first wiring pattern 240 is used to electrically connect the bonding pads 221 of the first semiconductor die 220 to the first conductive pattern 212 of the substrate 210. The first wiring pattern 240 is formed to penetrate the first patterning layer 230, and includes a first via pattern 241 which is formed to extend from the first surface 230a of the first patterning layer 230 to the bonding pads 221 in the manner best shown in FIG. 3. In addition to the first via pattern 241, the first wiring pattern 240 includes a second via pattern 242 which is formed to extend from the first surface 230a of the first patterning layer 230 to and into electrical communication with prescribed portions of the first conductive pattern 212. The first wiring pattern 240 further includes a connection pattern 243 which is provided to connect the first via pattern 241 to the second via pattern 242 in a prescribed arrangement.

As is shown in FIG. 3, both the first and second via patterns 241, 242 extend generally perpendicularly relative to the first surface 230a, with the connection pattern 243 extending generally perpendicularly between the first and second via patterns 241, 242. As a result, a portion of the connection pattern 243 is aligned with and extends in generally flush relation to the first surface 230a of the first patterning layer 230. However, those of ordinary skill in the art will recognize that the first wiring pattern 240 may be formed to have a variety of shapes or configurations according to the structure of the semiconductor package 200, the invention not being limited to the configuration of the first wiring pattern 240 as shown in FIG. 3 and described above. Each segment of the first wiring pattern 240 may also be formed to have a thickness of approximately several to several tens of micrometers. Further, the first wiring pattern 240 may be formed of a material such as gold, silver, copper, aluminum, or equivalent materials thereto, the present invention not being limited to any particular material for the first wiring pattern 240. Moreover, though it is contemplated that the first wiring pattern 240 will be formed to electrically communicate with each of the bonding pads 221 of the first semiconductor die 220, communication with each such bonding pad 221 is not a requirement in the semiconductor package 200.

The semiconductor package 200 further comprises a second (upper) semiconductor die 250 which defines a generally planar first (top) surface 250*a*, and an opposed, generally planar second (bottom) surface 250*b*. Formed on the first surface 250*a* of the second semiconductor die 250 is one or more bonding pads 251. The bonding pads 251 may be formed in a central region of the first surface 250*a*, or alternatively may be formed to extend in close proximity to the peripheral edge of the first surface 250*a* in the manner shown in FIG. 3. The second surface 250*b* of the second semiconductor die 250 is attached to the first surface 230*a* of the first patterning layer 230 and to an exposed portion of the first connection pattern 243 of the first wiring pattern 240 by an adhesive layer 252 which is interposed therebetween. The adhesive layer 252 may comprise a general epoxy adhesive, a double-sided adhesive tape, a double-sided adhesive film or equivalents thereto, the present invention not being limited to any specific material for the adhesive layer 252. Though shown in FIG. 3 as being identically sized, those of ordinary skill in the art will recognize that the first and second semiconductor dies 220, 250 may be differently sized and of dissimilar functionality.

The semiconductor package 200 of the present invention further comprises a second patterning layer 260 which is formed to cover the second semiconductor die 250, the exposed portion of the first surface 230*a* of the first protective layer 230, and any exposed portion of the first wiring pattern 240. The fully formed second patterning layer 260 defines a generally planar first (top) surface 260*a* and a second (side) surface 260*b* which extends generally perpendicularly relative to the first surface 260*a*. In this regard, the second surface 260*b* of the second patterning layer 260 extends in substantially flush relation to the second surface 230*b* of the first patterning layer 230, and further extends in generally coplanar relation to the third surface 210*c* of the insulative layer 211, the outer ends of the second and fourth conductive patterns 213, 215, and the outer ends of the first and second solder masks 218, 219. In the semiconductor package 200, the second patterning layer 260 is used to protect the second semiconductor die 250 and a second wiring pattern 270 (which will be described in more detail below) embedded in the first and second patterning layers 230, 260 from external impacts or oxidation. It is contemplated that the second patterning layer 260 may be formed of the same material as described above in relation to the first patterning layer 230.

As indicated above, the semiconductor package 200 further comprises a second wiring pattern 270 which is embedded in the first and second patterning layers 230, 260. The second wiring pattern 270 is provided to electrically couple or connect the second semiconductor die 250 to the substrate 210. More particularly, the second wiring pattern 270 is used to electrically connect the bonding pads 251 of the second semiconductor die 250 to the second conductive pattern 213 of the substrate 210. The second wiring pattern 270 is formed to penetrate the second and first patterning layers 260, 230, and includes a first via pattern 271 which is formed to extend from the first surface 260*a* of the second patterning layer 260 to the bonding pads 251 in the manner best shown in FIG. 3. In addition to the first via pattern 271, the second wiring pattern 270 includes a second via pattern 272 which is formed to extend from the first surface 260*a* of the second patterning layer 260 to the first surface 230*a* of the first patterning layer 230, and a third via pattern 273 which penetrates the first patterning layer 230, and extends from the second via pattern 272 to prescribed portions of the second conductive pattern 213. The second wiring pattern 270 further includes a connection pattern 274 which is provided to connect the first via pattern 271 to the second via pattern 272 in a prescribed arrangement. Since the second and third via patterns 272, 273 as shown in FIG. 3 are generally linearly aligned, those of ordinary skill in the art will recognize that they may be integrally formed with each other through the completion of a single drilling operation.

As is shown in FIG. 3, both the first, second and third via patterns 271, 272, 273 extend generally perpendicularly relative to the first surface 260*a*, with the connection pattern 274 extending generally perpendicularly between the first and second via patterns 271, 272. As a result, a portion of the connection pattern 274 is aligned with and extends in generally flush relation to the first surface 260*a* of the second patterning layer 260. However, those of ordinary skill in the art will recognize that the second wiring pattern 270 may be formed to have a variety of shapes or configurations according to the structure of the semiconductor package 200, the invention not being limited to the configuration of the second wiring pattern 270 as shown in FIG. 3 and described above. Each segment of the second wiring pattern 270 may also be formed to have a thickness of approximately several to several tens of micrometers. Further, the second wiring pattern 270 may be formed of a material such as gold, silver, copper, aluminum, or equivalent materials thereto, the present invention not being limited to any particular material for the second wiring pattern 270. Moreover, though it is contemplated that the second wiring pattern 270 will be formed to electrically communicate with each of the bonding pads 251 of the second semiconductor die 250, communication with each such bonding pad 251 is not a requirement in the semiconductor package 200.

The semiconductor package 200 further comprises a protective layer 280 which covers the first surface 260*a* of the second patterning layer 260 and thus the connection pattern 274 of the second wiring pattern 270. The protective layer 280 defines a generally planar first (top) surface 280*a*, and an opposed, generally planar second (bottom) surface 280*b* which directly contacts the first surface 260*a* of the second patterning layer 260 and the connection pattern 274 of the second wiring pattern 270. The protective layer 280 further defines a third (side) surface 280*c* which extends generally perpendicularly between the first and second surfaces 280*a*, 280*b*, and further preferably extends in substantially flush relation to the second surface 260*b* of the second patterning layer 260 in the manner shown in FIG. 3. The protective layer 280 is used to cover the second patterning layer 260 and the connection pattern 274 of the second wiring pattern 270 so as to prevent the second patterning layer 260 and the second wiring pattern 270 from being damaged or oxidized by external agents. It is contemplated that the protective layer 280 may be formed from a thermoresistant polymer film, such as a polyimide film, though the present invention is not intended to be limited to any particular material for the protective layer 280.

As indicated above, the solder balls 290 formed on the third and fourth conductive patterns 214, 215 are used to electrically couple or connect the semiconductor package 200 to an external device and to facilitate the transmission and receipt of electrical signals to and from such external device. The solder balls 290 may each be formed from Sn/Pb, leadless Sn, or an equivalent material, the present invention not being limited to any particular material for the solder balls 290.

As shown in FIG. 3, in the semiconductor package 200, the above-described first and second semiconductor dies 220, 250 are provided in a stacked arrangement. Those of ordinary skill in the art will recognize that the stacked configuration of the first and second semiconductor dies 220, 250 may be achieved in the semiconductor package 200 irrespective of whether such first and second semiconductor dies 220, 250 are provided in differing sizes and/or are of differing functionality. Additionally, since the first and second wiring patterns 240, 270 in the semiconductor package 200 are formed in respective ones of the first and second patterning layers 230, 260, it is not necessary to use spacers formed between the first and second semiconductor dies 220, 250, which represents a departure from known stacked semiconductor package structures. As a result, the semiconductor package 200 is thinner than many varieties of stacked semiconductor packages known in the art.

Figure 7:
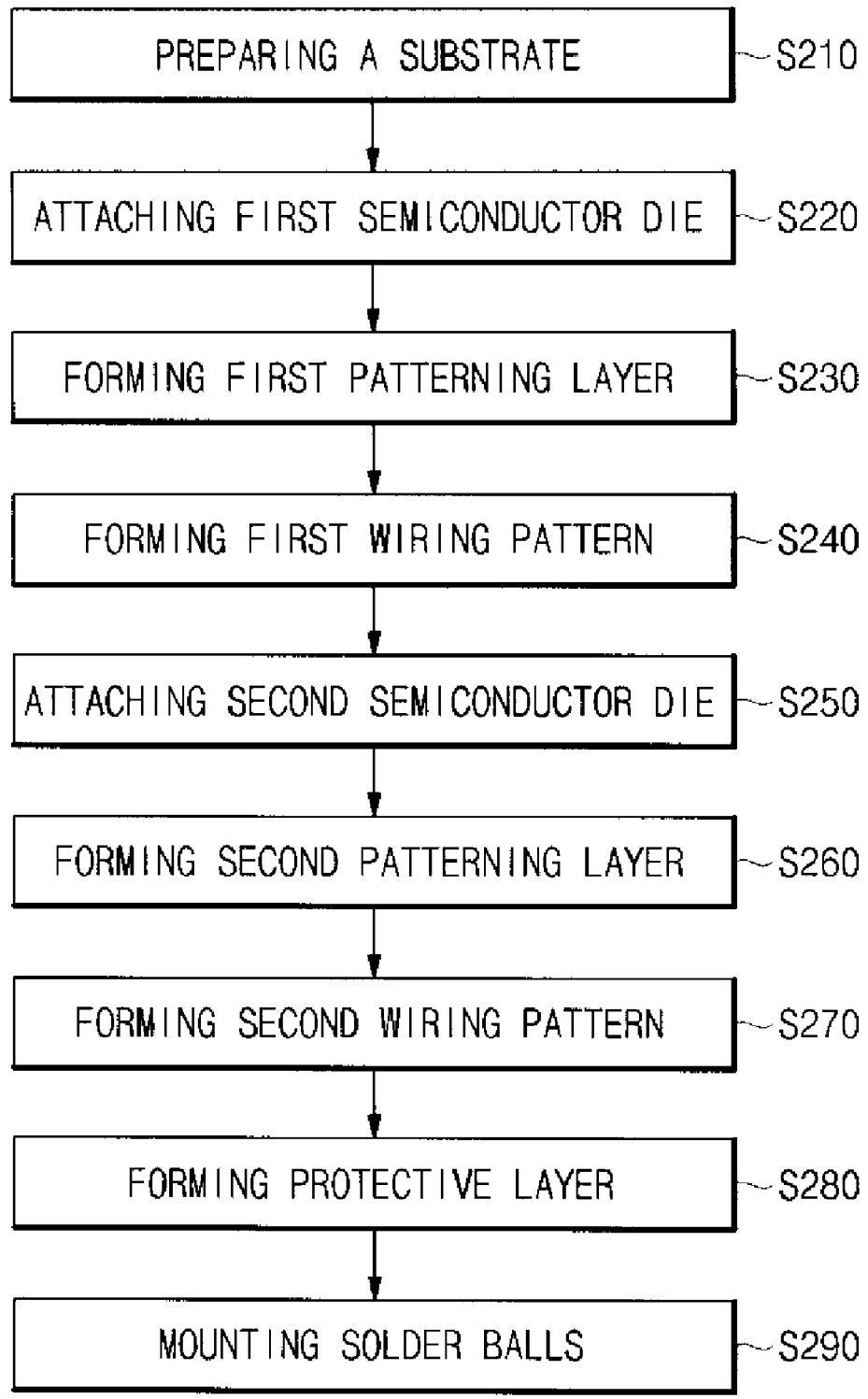
FIG. 7 is a flow chart describing an exemplary sequence of steps which may be used to facilitate the fabrication of the semiconductor package of the second embodiment shown in FIG. 3.

Referring now to FIG. 7, there is provided a flow chart which describes an exemplary sequence of steps which may be used to facilitate the fabrication of the semiconductor package 200 shown in FIG. 3. FIGS. 8A-8I depict an exemplary sequence of steps which may be used to facilitate the fabrication of the semiconductor package 200 in accordance with the flow chart shown in FIG. 7, as will be described in more detail below.

Figure 8A:
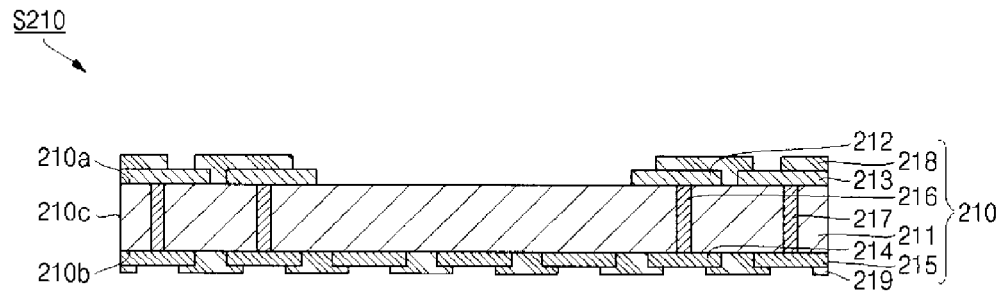
FIGS. 8A-8I illustrate an exemplary sequence of steps which may be used to facilitate the fabrication of the semiconductor package of the second embodiment shown in FIG. 3.

In the initial step of the fabrication process shown in FIG. 8A, the substrate 210 is prepared (FIG. 7, step S210). In preparing the substrate 210, the first and second conductive patterns 212, 213 are formed on the first surface 210a of the insulative layer 211, with the third and fourth conductive patterns 214, 215 being formed on the second surface 210b thereof. The first, second, third and fourth conductive patterns 212, 213, 214, 215 may be formed through the use of a photolithography process, though the present invention is not intended to be limited to any particular method of forming the same. The conductive vias 216 used to electrically connect the first and third conductive patterns 212, 214 to each other and the conductive vias 217 used to electrically connect the second and fourth conductive patterns 213, 215 to each other may be formed by the creation of via holes (not shown) in the insulative layer 211 through the use of a laser drill or an etching process, such via holes subsequently being filled or lined with a metal material so as to form the conductive vias 216, 217. It is contemplated that the first, second, third and fourth conductive patterns 212, 213, 214, 215 and conductive vias 216, 217 may each be formed of a metal material, such as copper, though the present invention is not intended to be limited to any specific materials in relation thereto. The above-described first and second solder masks 218, 219 which cover predetermined regions of the first, second, third and fourth conductive patterns 212, 213, 214, 215 as described above may be formed through a process of exposing and developing a thermosetting resin or a UV curable resin, though the present invention is also not intended to be limited to any particular method for forming the first and second solder masks 218, 219. As indicated above, the substrate 210 may comprise a general, rigid printed circuit board or an equivalent material. Additionally, though in FIG. 8A one insulative layer 211 is shown as being included in the substrate 210, a plurality of insulative layers 211 may be laminated to each other in a strip shape or in a matrix to form the substrate 210.

Figure 8B:
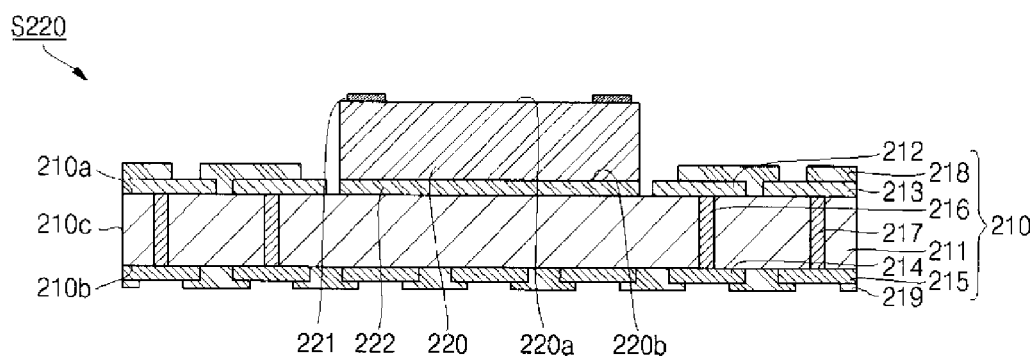

In the next step of the fabrication process for the semiconductor package 200 as shown in FIG. 8B, the first semiconductor die 220 is attached to the first surface 210a of the insulative layer 211 (FIG. 7, step S220). As indicated above, the attachment of the first semiconductor die 220 to the first surface 210a is preferably accomplished through the use of an adhesive layer 222. As also indicated above, the adhesive layer 222 is interposed and thus compressed between the second surface 220b of the first semiconductor die 220 and the first surface 210a of the insulative layer 211 of the substrate 210.

Figure 8C:
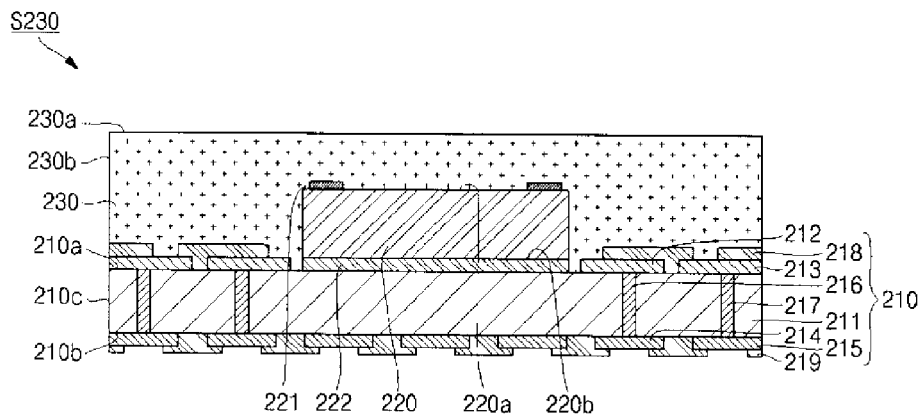

In the next step of the fabrication process for the semiconductor package 200 as shown in FIG. 8C, the first patterning layer 230 is formed on the substrate 210 and the first semiconductor die 220 in the size and configuration described above in relation to FIG. 3 (FIG. 7, step S230). In this regard, the first patterning layer 230 is formed by applying the materials used to fabricate the same to the first semiconductor die 220, the exposed portion of the first surface 210a of the insulative layer 211, the exposed portion of the first conductive pattern 212, the exposed portion of the second conductive pattern 213 other than for the outer end thereof, and the exposed portion of the first solder mask 218 other than for the outer end thereof. Subsequent to such application, the first patterning layer 230 is hardened through the use of heat. The first patterning layer 230 may be attached to the substrate 210 and the first semiconductor die 220 through the use of a semiconductor bonding device or a specially developed device. In hardening the first patterning layer 230, heat in the temperature range of about 130° C. to about 150° C. is applied to the first patterning layer 230 in an oven.

Figure 8D:
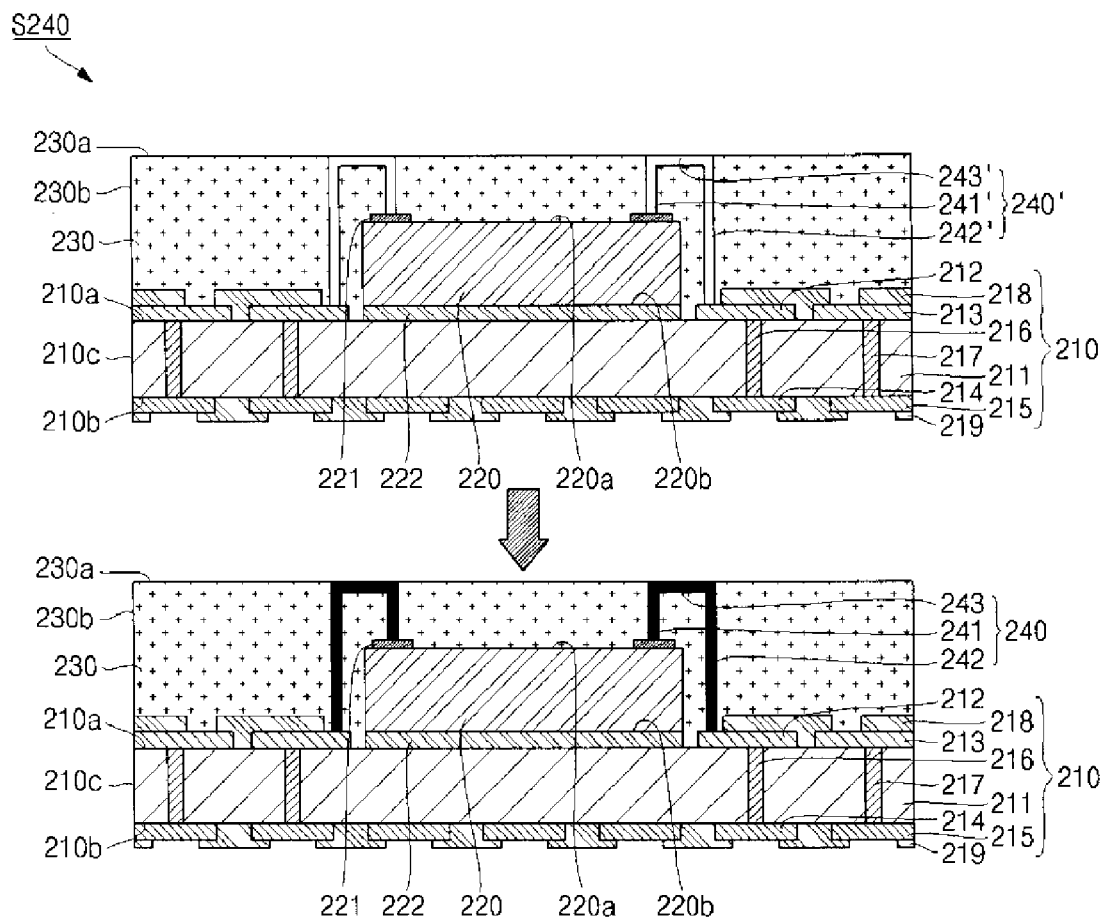

In the next step of the fabrication process for the semiconductor package 200 as shown in FIG. 8D, the above-described first wiring pattern 240 is formed in the first patterning layer 230 (FIG. 7, step S240). To facilitate the formation of the first wiring pattern 240, first via patterning holes 241' are initially formed in the first patterning layer 230, such first via patterning holes 241' extending generally perpendicularly between the first surface 230a of the first patterning layer 230 and respective ones of each of the bonding pads 221 of the first semiconductor die 220. Thereafter, second via patterning holes 242' are formed in the first patterning layer 230. Each of the second via patterning holes 242' extends generally perpendicularly between the first surface 230a of the first patterning layer 230 and a prescribed portion of the first conductive pattern 212. Subsequent to the formation of the first and second via patterning holes 241', 242', one or more connection patterning holes 243' are formed in the first patterning layer 230, each patterning hole 243' extending generally perpendicularly between a corresponding pair of the first and second via patterning holes 241', 242' in the manner shown in FIG. 8D. Thus, each connection patterning hole 243' effectively connects each first via patterning hole 241' to a respective one of the second via patterning holes 242'. Each connection patterning hole 243' is formed to be of a prescribed depth relative to the first surface 230a of the first patterning layer 230.

As is further shown in FIG. 8D, each connection patterning hole 243' and the corresponding pair of first and second via patterning holes 241', 242' collectively define a patterning hole 240'. Each patterning hole 240' may be formed by milling using a micro-drilling or laser processing method, though the present invention is not intended to be limited to any specific method for forming any patterning hole 240' within the first patterning layer 230. Subsequent to the formation of the patterning hole(s) 240', a conductive material in the form of ink or paste is injected into such patterning hole(s) 240', thus forming the first via pattern 241, the second via pattern 242, and the connection pattern 243 of the first wiring pattern 240. In the semiconductor package 200, it is contemplated that the injected conductive material may include gold, silver, copper, aluminum, or an equivalent material thereto, the present invention not being limited to any particular material for use in fabricating the first wiring pattern 240. Additionally, the injection of the conductive material into the patterning hole(s) 240' to facilitate the formation of the first wiring pattern 240 may be accomplished through the use of screen printing, writing, plating, or an equivalent technique, the present invention also not being limited to any particular injection method. After the conductive material is injected into the patterning hole(s) 240', the first wiring pattern 240 is cured by the application of heat to the first patterning layer 230 in a temperature range of about 150° C. to about 200° C.

Figure 8E:
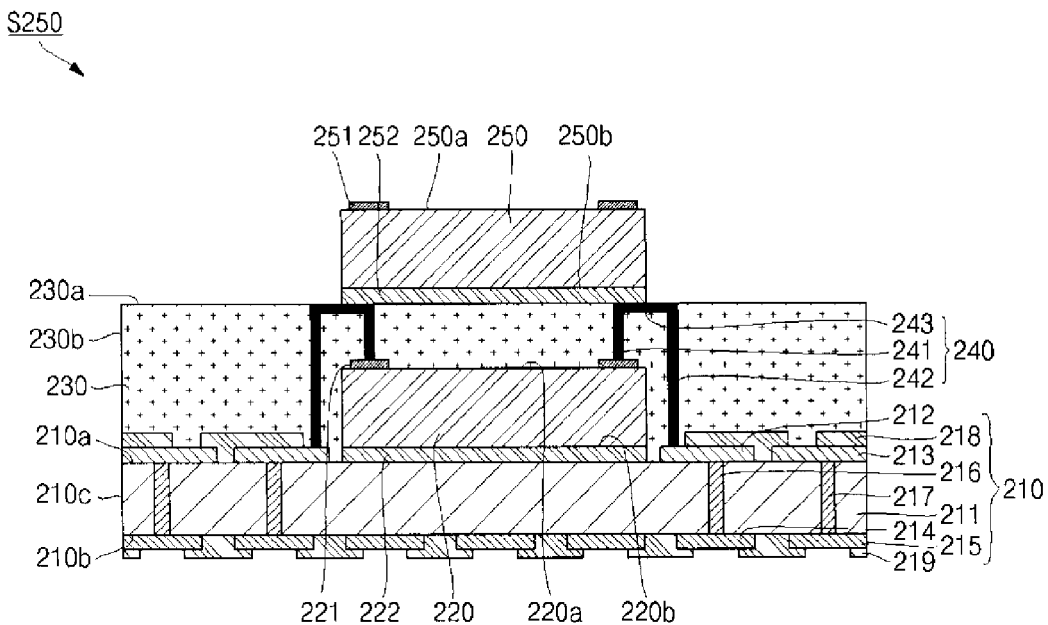

In the next step of the fabrication process for the semiconductor package 200 as shown in FIG. 8E, the second semiconductor die 250 is attached to the first surface 230a of the first patterning layer 230 and to an exposed portion of the first connection pattern 243 of the first wiring pattern 240 by the adhesive layer 252 (FIG. 7, step S250). As indicated above, the adhesive layer 252 is interposed and thus compressed between the second surface 250b of the second semiconductor die 250 and the first surface 230a of the first patterning layer 230. As indicated above, though shown in FIG. 8E as being identically sized, those of ordinary skill in the art will recognize that the first and second semiconductor dies 220, 250 may be differently sized and of dissimilar functionality. In this regard, though the second semiconductor die 250 is also shown in FIG. 8E as covering only a portion of the connection pattern 243 of the first wiring pattern 240, such second semiconductor die 250 may be sized so as to cover the entirety of or none of the connection pattern 243.

Figure 8F:
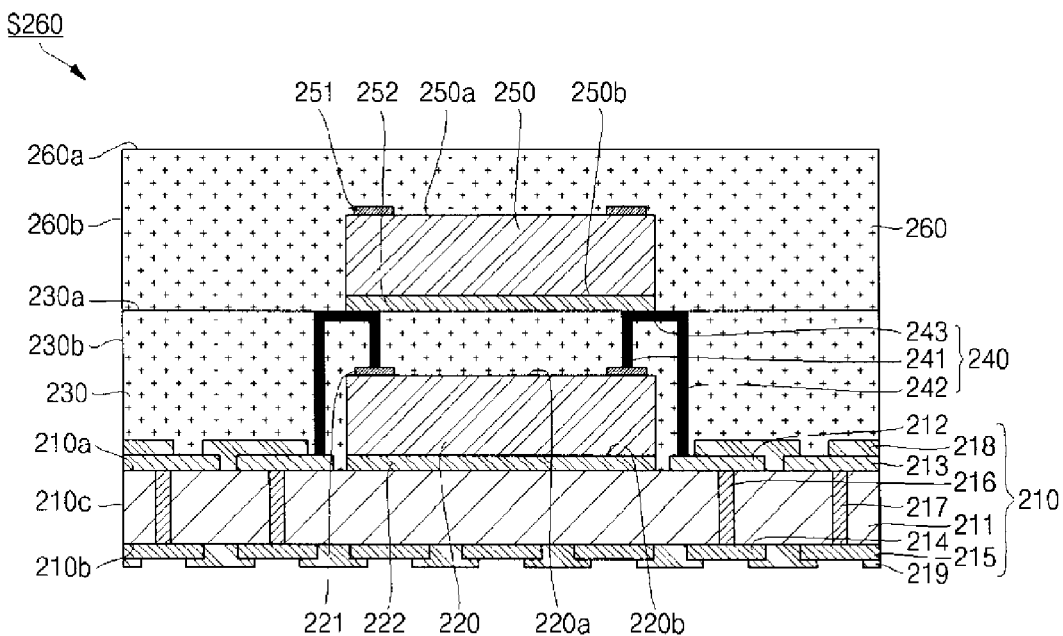

In the next step of the fabrication process for the semiconductor package 200 as shown in FIG. 8F, the second patterning layer 260 is formed on the second semiconductor die 250, the exposed portion of the first surface 230a of the first protective layer 230, and any exposed portion of the first wiring pattern 240 (FIG. 7, step S260). The second patterning layer 260 is further formed in the size and configuration described above in relation to FIG. 3. In this regard, the second patterning layer 260 is formed by applying the same material used to fabricate the first patterning layer 230 to the second semiconductor die 250, the exposed portion of the first surface 230a of the first patterning layer 230 and any exposed portion of the first wiring pattern 240. Subsequent to such application, the second patterning layer 260 is hardened through the use of heat applied in the temperature range of about 130° C. to about 150° C.

Figure 8G:
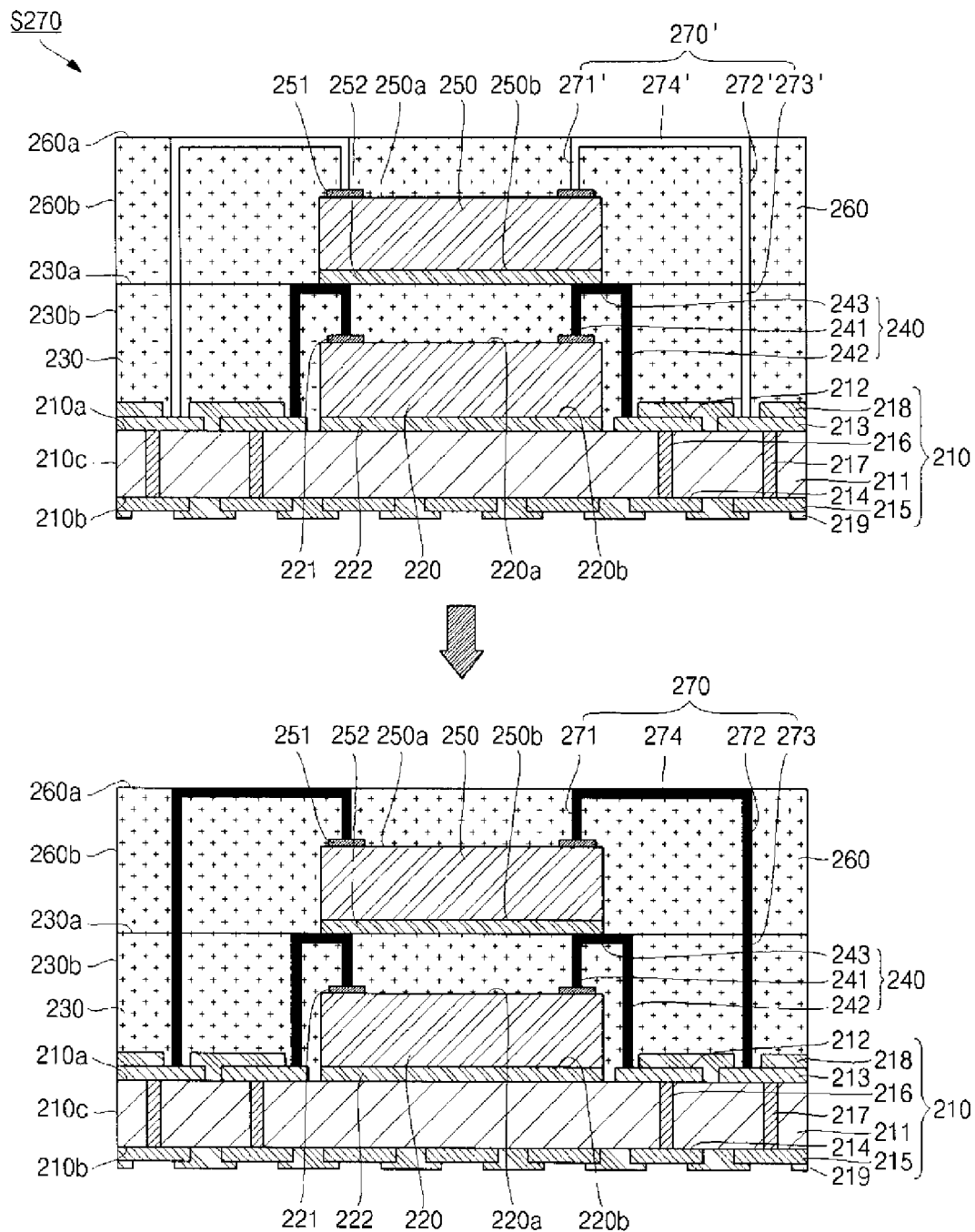

In the next step of the fabrication process for the semiconductor package 200 as shown in FIG. 8G, the above-described second wiring pattern 270 is formed in the second and first patterning layers 260, 230 (FIG. 7, step S270). To facilitate the formation of the second wiring pattern 270, first via patterning hole(s) 271' are initially formed in the second patterning layer 260, such first via patterning holes 271' extending generally perpendicularly between the first surface 260a of the second patterning layer 260 and respective ones of the bonding pads 251 of the second semiconductor die 250. Thereafter, second via patterning holes 272' are formed in the second patterning layer 260, each of the second via patterning holes 272' extending generally perpendicularly between the first surface 260a of the second patterning layer 260 and the first surface 230a of the first patterning layer 230. Third via patterning holes 273' are then formed to penetrate the first patterning layer 230, each of the third via patterning holes 273' being generally linearly aligned with a respective one of the second via patterning holes 272' and extending to a prescribed portion of the second conductive pattern 213. As indicated above, each aligned pair of second and third patterning holes 272', 273' may be integrally formed with each other through the completion of a single drilling operation. Subsequent to the formation of the first, second and third via patterning holes 271', 272', 273', one or more connection patterning holes 274' are formed in the second patterning layer 260, each patterning hole 274' extending generally perpendicularly between a corresponding pair of the first and second via patterning holes 271', 272' in the manner shown in FIG. 8G. Thus, each connection patterning hole 274' effectively connects each first via patterning hole 271' to a respective one of the second via patterning holes 272'. Each connection patterning hole 274' is formed to be of a prescribed depth relative to the first surface 260a of the second patterning layer 260.

As is further shown in FIG. 8G, each connection patterning hole 274' and the corresponding first, second and third via patterning holes 271', 272', 273' collectively define a patterning hole 270'. Each patterning hole 270' may be formed by milling using a micro-drilling or laser processing method, though the present invention is not intended to be limited to any specific method for forming any patterning hole 270' within the second patterning layer 260. Subsequent to the formation of the patterning hole(s) 270', a conductive material in the form of ink or paste is injected into such patterning hole(s) 270', thus forming the first via pattern 271, the second via pattern 272, the third via pattern 273 and the connection pattern 274 of the second wiring pattern 270. In the semiconductor package 200, it is contemplated that the injected conductive material may include gold, silver, copper, aluminum, or an equivalent material thereto, the present invention also not being limited to any particular material for use in fabricating the second wiring pattern 270. Additionally, the injection of the conductive material into the patterning hole(s) 270' to facilitate the formation of the second wiring pattern 270 may be accomplished through the use of screen printing, writing, plating or an equivalent technique, the present invention also not being limited to any particular injection method. After the conductive material is injected into the patterning hole(s) 270', the second wiring pattern 270 is cured by the application of heat to the second patterning layer 260 in a temperature range of about 150° C. to about 250° C.

Figure 8H:
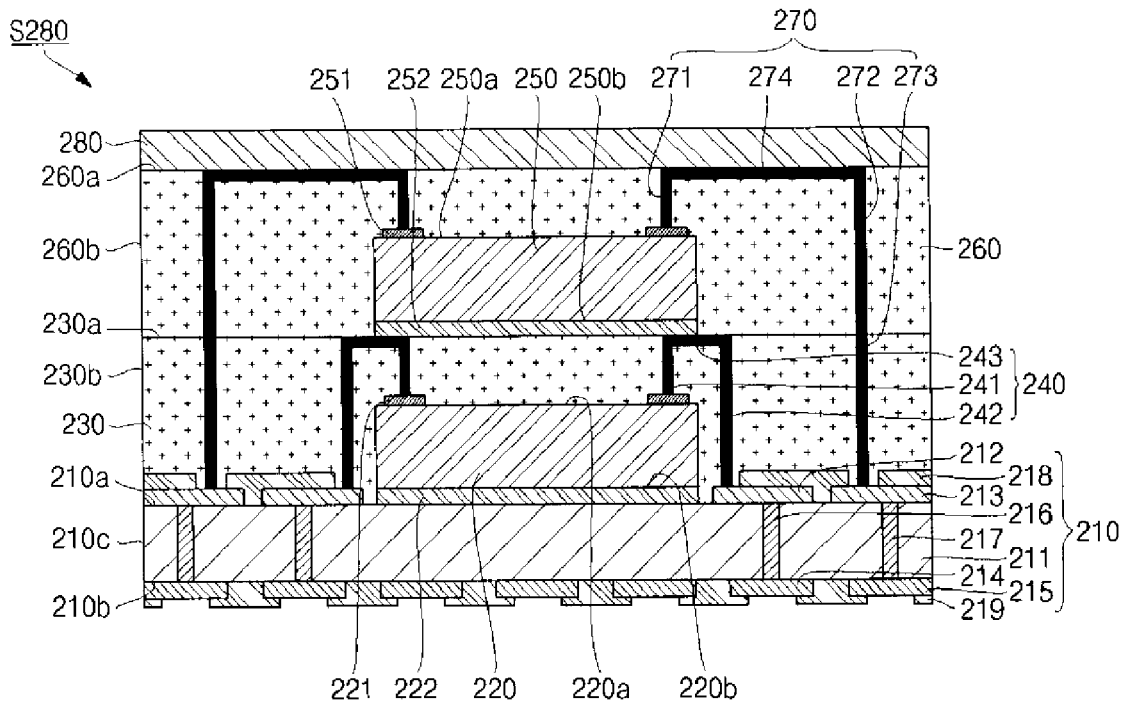

In the next step of the fabrication method for the semiconductor package 200 as shown in FIG. 8H, the protective layer 280 is formed on the second patterning layer 260 so as to cover the exposed portion of the second wiring pattern 270 (FIG. 7, step S280). It is contemplated that the protective layer 280 may be formed by the same method used to form the first and second patterning layers 230, 260. More particularly, the protective layer 280 may be formed by bonding the material used to form the same to the second patterning layer 260 and the exposed portion of the connection pattern 274 of the second wiring pattern 270, and thereafter hardening such material. As indicated above, the protective layer 280 covers the first surface 260a of the second patterning layer 260 and the exposed portion of the connection pattern 274 of the second wiring pattern 270 so as to prevent the second patterning layer 260 and the second wiring pattern 270 from being damaged or oxidized by external agents.

Figure 8I:
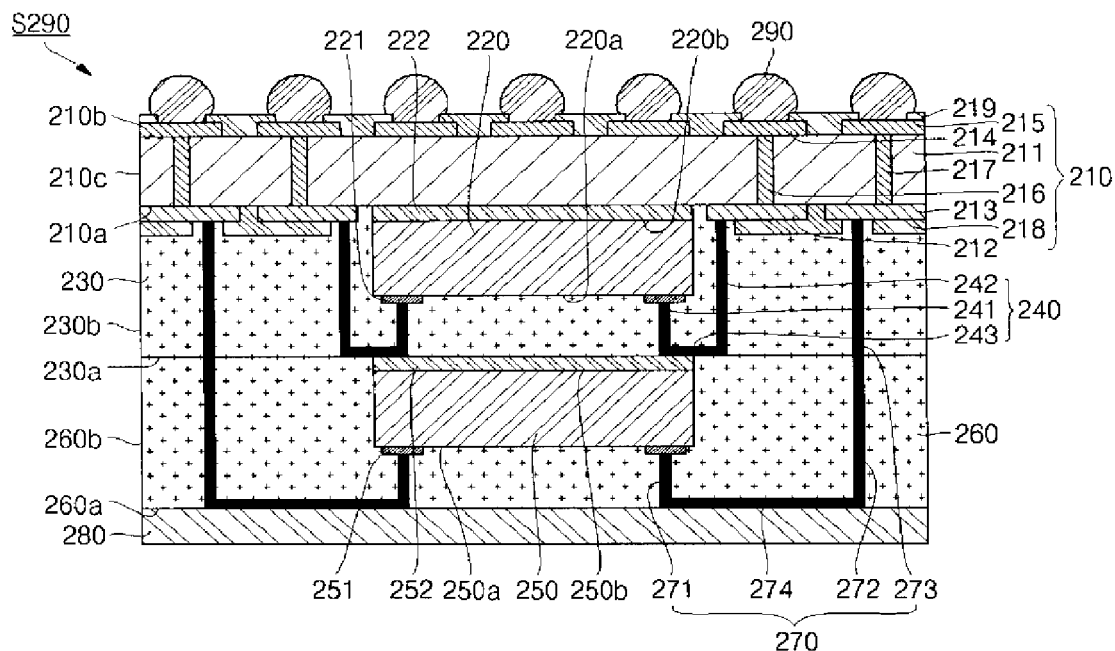

In the final step of the fabrication process for the semiconductor package 200 as shown in FIG. 8I, the solder balls 290 are mounted and electrically connected to the third and fourth conductive patterns 214, 215 of the substrate 210 (FIG. 7, step S290). The formation of the solder balls 290 preferably occurs in the same manner described above in relation to FIG. 6F regarding the formation of the solder balls 160.

Figure 3A:
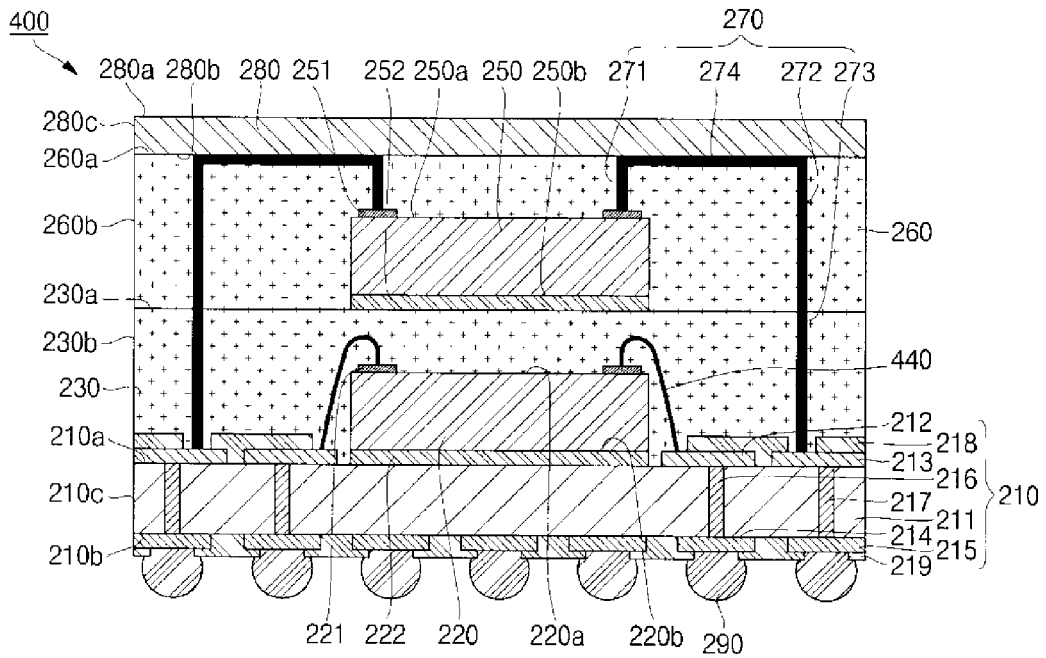
FIG. 3A is a cross-sectional view of a semiconductor package constructed in accordance with a first variant of the second embodiment shown in FIG. 3.

Referring now to FIG. 3A, there is shown a semiconductor package 400 which comprises a first variant of the semiconductor package 200 shown and described above in relation to FIG. 3. The semiconductor package 400 is substantially identical to the semiconductor package 200, with the sole distinction lying in the substitution of the above-described first wiring pattern 240 in the semiconductor package 200 with conventional conductive wires 440 in the semiconductor package 400. More particularly, as is seen in FIG. 3A, in the semiconductor package 400, conductive wires 440 are used to electrically connect the bonding pads 221 of the first semiconductor die 220 to the first conductive pattern 212 of the substrate 210 in a prescribed pattern or arrangement. The conductive wires 440 are fully encapsulated by the first patterning layer 230 of the semiconductor package 400.

Figure 3B:
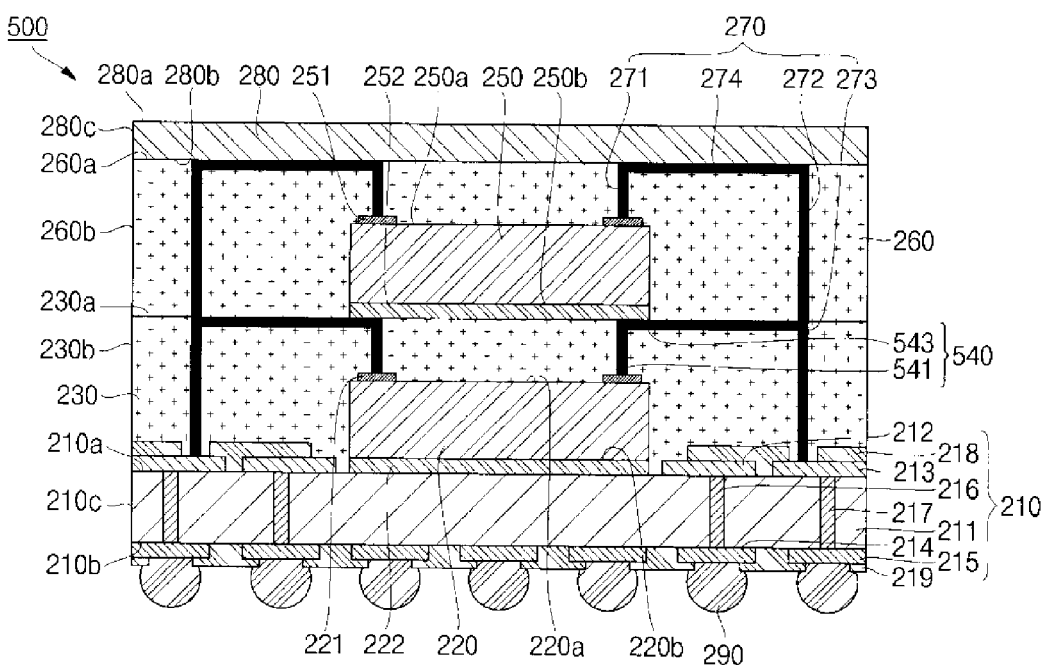
FIG. 3B is a cross-sectional view of a semiconductor package constructed in accordance with a second variant of the second embodiment shown in FIG. 3.

Referring now to FIG. 3B, there is shown a semiconductor package 500 which comprises a second variant of the semiconductor package 200 shown and described above in relation to FIG. 3. The semiconductor package 500 is also substantially identical to the semiconductor package 200, with the sole distinction lying the substitution of the first wiring pattern 240 of the semiconductor package 200 with the first wiring pattern 540 in the semiconductor package 500. In the semiconductor package 500, the first wiring pattern 540 is used to electrically connect the bonding pads 221 of the first semiconductor die 220 to the second wiring pattern 270. This is in contrast to the semiconductor package 200 wherein the first wiring pattern 240 is used to electrically connect the bonding pads 221 of the first semiconductor die 220 to the first conductive pattern 212 of the substrate 210. More particularly, the first wiring pattern 540 is formed to penetrate the first patterning layer 230, and includes a first via pattern 541 which is formed to extend from the first surface 230a of the first patterning layer 230 to the bonding pads 221 in the manner shown in FIG. 3B. In addition to the first via pattern 541, the first wiring pattern 540 includes a connection pattern 543 which is provided to connect the first via pattern 541 to the second wiring pattern 270 in a prescribed arrangement.

As is further seen in FIG. 3B, the first via pattern 541 extends generally perpendicularly relative to the first surface 230a, with the connection pattern 543 extending generally perpendicularly between the first via pattern 541 and the third via pattern 273 of the second wiring pattern 270. As a result, a portion of the connection pattern 543 is aligned with and extends in generally flush relation to the first surface 230a of the first patterning layer 230. Those of ordinary skill in the art will recognize that the fabrication methodology for the semiconductor package 500, as well as that for the semiconductor package 400 described above, substantially mirrors the fabrication methodology for the semiconductor package 200 as described above in relation to FIGS. 8A-8I.

Though not shown, in accordance with one potential variant of the semiconductor package 500, the first wiring pattern 540 may be configured to electrically connect the bonding pads 221 of the first semiconductor die 220 to prescribed portions of the second conductive pattern 213 rather than to the second wiring pattern 270. In this case, those portions of the second conductive pattern 213 to which the first wiring pattern 570 is electrically connected differ from those to which the second wiring pattern 270 is electrically connected through the use of the third via pattern 273 thereof. In this particular variant of the semiconductor package 500, the first wiring pattern 540 may formed to penetrate the first patterning layer 230, and may include the first via pattern 541 which is formed to extend from the first surface 230a of the first patterning layer 230 to the bonding pads 221 in the manner shown in FIG. 3B. In addition to the first via pattern 541, the first wiring pattern 540 may include a second via pattern (not shown) which is formed to extend from the first surface 230a of the patterning layer 230 to and into electrical communication with prescribed portions of the second conductive pattern 213, and the connection pattern 543 which connects the first via pattern 541 to the second via pattern in a prescribed arrangement. The first via pattern 541 and the second via pattern each extend generally perpendicularly relative to the first surface 230a, with the connection pattern 543 extending generally perpendicularly between the first via pattern 541 and the second via pattern of the first wiring pattern 540. As a result, a portion of the connection pattern 543 is aligned with and extends in generally flush relation to the first surface 230a of the first patterning layer 230. Those of ordinary skill in the art will recognize that the fabrication methodology for this variant of the semiconductor package 500 also substantially mirrors the fabrication methodology for the semiconductor package 200 as described above in relation to FIGS. 8A-8I.

Figure 4:
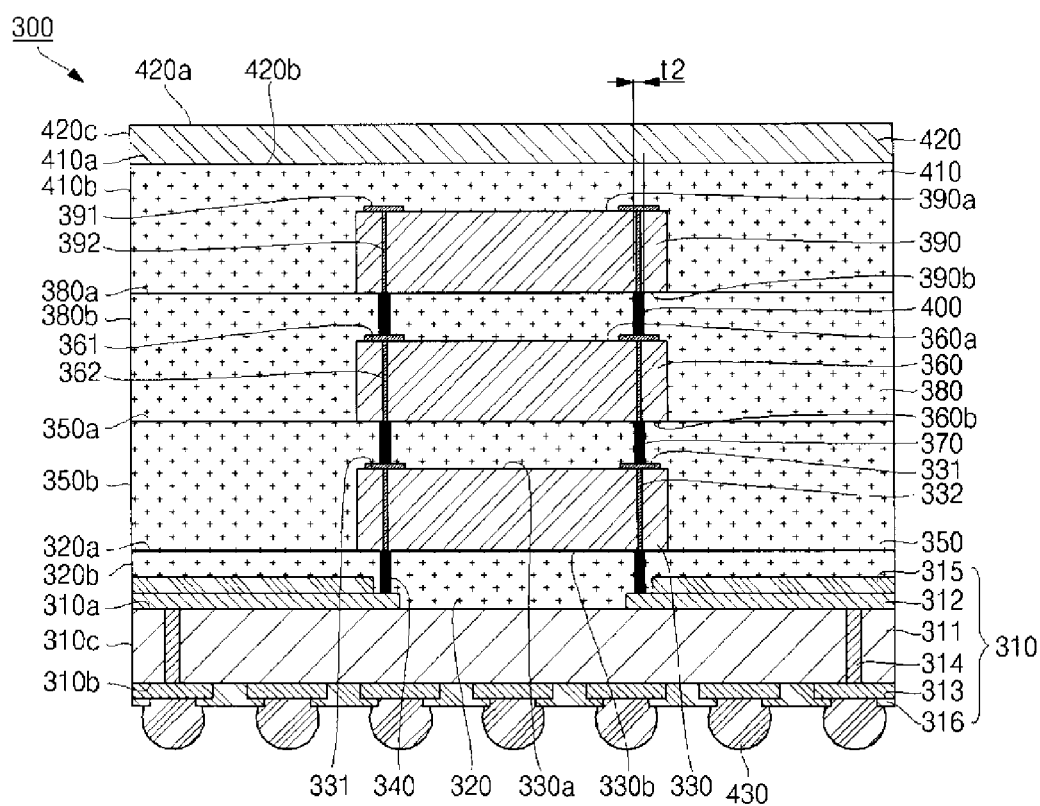
FIG. 4 is a cross-sectional view of a semiconductor package constructed in accordance with a third embodiment of the present invention.

Referring now to FIG. 4, there is shown a semiconductor package 300 constructed in accordance with a third embodiment of the present invention. The semiconductor package 300 comprises a substrate 310. The substrate 310 comprises an insulative layer 311 which defines a generally planar first (top) surface 310a and an opposed, generally planar second (bottom) surface 310b. The insulative layer 311 further comprises a third (side) surface 310c which extends generally perpendicularly between the first and second surfaces 310a, 310b.

The substrate 310 further comprises a first electrically conductive pattern 312 which is formed on the first surface 310a, and a second electrically conductive pattern 313 which is formed on the second surface 310b. The first and second conductive patterns 312, 313 may each comprise various pads, traces, or combinations thereof. In the substrate 310, the first and second conductive patterns 312, 313 are electrically connected to each other in a prescribed pattern or arrangement through the use of conductive vias 314 which extend through the insulative layer 311 between the first and second surfaces 310a, 310b thereof in the manner shown in FIG. 4. The substrate 310 further preferably includes a first solder mask 315 which covers a predetermined region of the first conductive pattern 312, and a second solder mask 316 which covers a predetermined region of the second conductive pattern 313. The first and second solder masks 315, 316 are provided to prevent respective ones of the first and second conductive patterns 312, 313 from being oxidized or corroded when such first and second conductive patterns 312, 313 are exposed to the outside environment. Additionally, as is also seen in FIG. 4, it is contemplated that in the substrate 310, solder balls 430 will be electrically coupled to the second conductive pattern 313 in a prescribed arrangement, such solder balls 430 being used to transmit electrical signals from the semiconductor package 300 to an external device. The substrate 310 of the semiconductor package 300 may comprise a general, rigid printed circuit board, a flexible printed circuit board, or an equivalent thereto, the present invention not being limited to any particular combination of materials for the substrate 310.

The semiconductor package 300 of the present invention further comprises a first patterning layer 320 which is formed to cover the exposed portion of the first surface 310a of the insulative layer 311, and all but the outer ends of the first conductive pattern 312 and first solder mask 315. The fully formed first patterning layer 320 defines a generally planar first (top) surface 320a and a second (side) surface 320b which extends generally perpendicularly relative to the first surface 320a. In this regard, the second surface 320b of the first patterning layer 320 extends in substantially coplanar relation to the third surface 310c of the insulative layer 311, and further extends in generally coplanar relation to the outer ends of the first and second conductive patterns 312, 313, as well as the outer ends of the first and second solder masks 315, 316.

The semiconductor package 300 further comprises a first semiconductor die 330 which defines a generally planar first (top) surface 330a, and an opposed, generally planar second (bottom) surface 330b. Formed on the first surface 330a of the first semiconductor die 330 is one or more bonding pads 331. The bonding pads 331 may be formed in the central region of the first surface 330a, or alternatively may be formed to extend in close proximity to the peripheral edge of the first surface 330a in the manner shown in FIG. 4. The first semiconductor die 330 further includes the first through hole vias 332 which extend between the first and second surfaces 330a, 330b. More particularly, each via 332 is formed to be electrically connected to and extend generally perpendicularly from a respective one of the bonding pads 331 to the second surface 330b. Each via 332 may be formed of a metal material, such as copper, though the present invention is not intended to be limited to any specific material for the vias 332. In the semiconductor package 300, the second surface 330b of the first semiconductor die 330 is attached to the first surface 320a of the first patterning layer 320 in the manner shown in FIG. 4.

As is further shown in FIG. 4, in the semiconductor package 300, a first wiring pattern 340 is provided in the first patterning layer 320 to electrically connect or couple the first semiconductor die 330 to the substrate 310. More particularly, the first wiring pattern 340 is used to electrically connect the bonding pads 331 of the first semiconductor die 330 to the first conductive pattern 312 of the substrate 310. In this regard, the first wiring pattern 340 is formed to penetrate the first patterning layer 320 and defines one or more segments which extend generally perpendicularly from the first surface 320a of the first patterning layer 320 to and into electrical communication with prescribed portions of the first conductive pattern 312. Importantly, the first wiring pattern 340 is configured such that each of the segments thereof is aligned with and electrically connected to a respective one of the vias 332 of the first semiconductor die 330, and hence respective ones of the bonding pads 331. Additionally, each segment of the first wiring pattern 340 is preferably formed to have a thickness of approximately several to several tens of micrometers. Those of ordinary skill in the art will recognize that the first wiring pattern 340 may be formed to have a variety of shapes or configurations according to the structure of the semiconductor package 300, the present invention not being limited to the configuration of the first wiring pattern 340 as shown in FIG. 4 and described above. Further, the first wiring pattern 340 may be formed of a material such as gold, silver, copper, aluminum or equivalent materials thereto, the present invention not being limited to any particular material for the first wiring pattern 340. Moreover, though it is contemplated that the first wiring pattern 340 will be formed to electrically communicate with each of the bonding pads 331 of the first semiconductor die 330, communication with each such bonding pad 331 is not a requirement in the semiconductor package 300. Those of ordinary skill in the art will recognize that the first wiring pattern 340 will be formed in the first patterning layer 320 prior to the attachment of the first semiconductor die 330 to the first surface 320a thereof.

The semiconductor package 300 of the present invention further comprises a second patterning layer 350 which is formed to cover the exposed portion of the first surface 320a of the first patterning layer 320 and the first semiconductor die 330 disposed thereon. The fully formed second patterning layer 350 defines a generally planar first (top) surface 350a and a second (side) surface 350b which extends generally perpendicularly relative to the first surface 350a. In this regard, the second surface 350b of the second patterning layer 320 extends in substantially coplanar relation to the second surface 320b of the first patterning layer 320.

The semiconductor package 300 further comprises a second semiconductor die 360 which defines a generally planar first (top) surface 360a, and an opposed, generally planar second (bottom) surface 360b. Formed on the first surface 360a of the second semiconductor die 360 is one or more bonding pads 361. The bonding pads 361 may be formed in the central region of the first surface 360a, or alternatively may be formed to extend in close proximity to the peripheral edge of the first surface 360a in the manner shown in FIG. 4. The second semiconductor die 360 further includes the first through hole vias 362 which extend between the first and second surfaces 360a, 360b. More particularly, each via 362 is formed to be electrically connected to and extend generally perpendicularly from a respective one of the bonding pads 361 to the second surface 360b. Each via 362 may be formed of a metal material, such as copper, though the present invention is not intended to be limited to any specific material for the vias 362. In the semiconductor package 300, the second surface 360b of the second semiconductor die 360 is attached to the first surface 350a of the second patterning layer 350 in the manner shown in FIG. 4.

As is further shown in FIG. 4, in the semiconductor package 300, a second wiring pattern 370 is provided in the second patterning layer 350 to electrically connect or couple the second semiconductor die 360 to the first semiconductor die 330. More particularly, the second wiring pattern 370 is used to electrically connect the bonding pads 361 of the second semiconductor die 360 to respective ones of the bonding pads 331 of the underlying first semiconductor die 330. In this regard, the second wiring pattern 370 is formed to penetrate the second patterning layer 350 and defines one or more segments which extend generally perpendicularly from the first surface 350a of the second patterning layer 350 to and into electrical communication with respective ones of the bonding pads 331. Importantly, the second wiring pattern 370 is configured such that each of the segments thereof is also aligned with and electrically connected to a respective one of the vias 362 of the second semiconductor die 360, and hence respective ones of the bonding pads 361. Additionally, each segment of the second wiring pattern 370 is preferably formed to have a thickness of approximately several to several tens of micrometers. Those of ordinary skill in the art will recognize that the second wiring pattern 370 may be formed to have a variety of shapes or configurations according to the structure of the semiconductor package 300, the present invention not being limited to the configuration of the second wiring pattern 370 as shown in FIG. 4 and described above. Further, the second wiring pattern 370 may be formed of a material such as gold, silver, copper, aluminum or equivalent materials thereto, the present invention not being limited to any particular material for the second wiring pattern 370. Moreover, though it is contemplated that the second wiring pattern 370 will be formed to electrically communicate with each of the bonding pads 361 of the second semiconductor die 360, communication with each such bonding pad 361 is not a requirement in the semiconductor package 300. Those of ordinary skill in the art will recognize that the second wiring pattern 370 will be formed in the second patterning layer 350 prior to the attachment of the second semiconductor die 360 to the first surface 350a thereof.

The semiconductor package 300 of the present invention further comprises a third patterning layer 380 which is formed to cover the exposed portion of the first surface 350a of the second patterning layer 350 and the second semiconductor die 360 disposed thereon. The fully formed third patterning layer 380 defines a generally planar first (top) surface 380a and a second (side) surface 380b which extends generally perpendicularly relative to the first surface 380a. In this regard, the second surface 380b of the third patterning layer 380 extends in substantially coplanar relation to the second surface 350b of the second patterning layer 350.

The semiconductor package 300 further comprises a third semiconductor die 390 which defines a generally planar first (top) surface 390a, and an opposed, generally planar second (bottom) surface 390b. Formed on the first surface 390a of the third semiconductor die 390 is one or more bonding pads 391. The bonding pads 391 may be formed in the central region of the first surface 390a, or alternatively may be formed to extend in close proximity to the peripheral edge of the first surface 390a in the manner shown in FIG. 4. The third semiconductor die 390 further includes the first through hole vias 392 which extend between the first and second surfaces 390a, 390b. More particularly, each via 392 is formed to be electrically connected to and extend generally perpendicularly from a respective one of the bonding pads 391 to the second surface 390b. Each via 392 may be formed of a metal material, such as copper, though the present invention is not intended to be limited to any specific material for the vias 392. In the semiconductor package 300, the second surface 390b of the third semiconductor die 390 is attached to the first surface 380a of the third patterning layer 380 in the manner shown in FIG. 4.

As is further shown in FIG. 4, in the semiconductor package 300, a third wiring pattern 400 is provided in the third patterning layer 380 to electrically connect or couple the third semiconductor die 390 to the second semiconductor die 360. More particularly, the third wiring pattern 400 is used to electrically connect the bonding pads 391 of the third semiconductor die 390 to respective ones of the bonding pads 361 of the underlying second semiconductor die 360. In this regard, the third wiring pattern 400 is formed to penetrate the third patterning layer 380 and defines one or more segments which extend generally perpendicularly from the first surface 380a of the third patterning layer 380 to and into electrical communication with respective ones of the bonding pads 361. Importantly, the third wiring pattern 400 is configured such that each of the segments thereof is also aligned with and electrically connected to a respective one of the vias 392 of the third semiconductor die 390, and hence respective ones of the bonding pads 391. Additionally, each segment of the third wiring pattern 400 is preferably formed to have a thickness of approximately several to several tens of micrometers. Those of ordinary skill in the art will recognize that the third wiring pattern 400 may be formed to have a variety of shapes or configurations according to the structure of the semiconductor package 300, the present invention not being limited to the configuration of the third wiring pattern 400 as shown in FIG. 4 and described above. Further, the third wiring pattern 400 may be formed of a material such as gold, silver, copper, aluminum or equivalent materials thereto, the present invention not being limited to any particular material for the third wiring pattern 400. Moreover, though it is contemplated that the third wiring pattern 400 will be formed to electrically communicate with each of the bonding pads 391 of the third semiconductor die 390, communication with each such bonding pad 391 is not a requirement in the semiconductor package 300. Those of ordinary skill in the art will recognize that the third wiring pattern 400 will be formed in the third patterning layer 380 prior to the attachment of the third semiconductor die 390 to the first surface 380a thereof.

The semiconductor package 300 of the present invention further comprises a fourth patterning layer 410 which is formed to cover the exposed portion of the first surface 380a of the third patterning layer 380 and the third semiconductor die 390 disposed thereon. The fully formed fourth patterning layer 410 defines a generally planar first (top) surface 410a and a second (side) surface 410b which extends generally perpendicularly relative to the first surface 410a. In this regard, the second surface 410b of the fourth patterning layer 410 extends in substantially coplanar relation to the second surface 380b of the third patterning layer 380.

The semiconductor package 300 further comprises a protective layer 420 which covers the first surface 410a of the fourth patterning layer 410. The protective layer 420 defines a generally planar first (top) surface 420a, and an opposed, generally planar second (bottom) surface 420b which directly contacts the first surface 410a of the fourth patterning layer 410. The protective layer 420 further defines a third (side) surface 420c which extends generally perpendicularly between the first and second surfaces 420a, 420b, and further preferably extends in substantially flush relation to the second surface 410b of the fourth patterning layer 410 in the manner shown in FIG. 4. The protective layer 420 is used to cover the fourth patterning layer 410 so as to prevent the same from being damaged or oxidized by external agents. It is contemplated that the protective layer 420 may be formed from a thermoresistant polymer film, such as a polyimide film, though the present invention is not intended to be limited to any particular material for the protective layer 420.

In the semiconductor package 300, it is contemplated that the first, second, third and fourth patterning layers 320, 350, 380 and 410 and the protective layer 420 may each be fabricated from the same material, and that the first, second and third wiring patterns 340, 370, 400 may also each be fabricated from the same material. Additionally, though not shown in FIG. 4, it is contemplated that the electrical interface between the lower ends of the vias 332, 362, 392 of the semiconductor dies 320, 360, 390 (as viewed from the perspective shown in FIG. 4) may be electrically connected to respective ones of the wiring patterns 340, 370, 400 through the use of intervening conductive bumps. If included, such conductive bumps would be partially encapsulated by respective ones of the first, second and third patterning layers 320, 350, 380.

Referring now to FIGS. 9A-9M, there is depicted an exemplary sequence of steps which may be used to facilitate the fabrication of the semiconductor package 300, as will be described in more detail below.

Figure 9A:
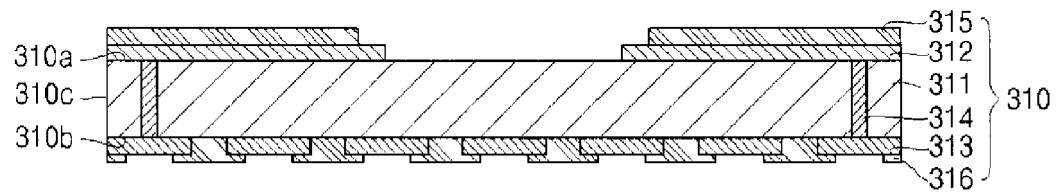
FIGS. 9A-9M illustrate an exemplary sequence of steps which may be used to facilitate the fabrication of the semiconductor package of the third embodiment shown in FIG. 4.

In the initial step of the fabrication process shown in FIG. 9A, the substrate 310 is prepared. In preparing the substrate 310, the first conductive pattern 312 is formed on the first surface 310a of the insulative layer 311, with the second conductive pattern 313 being formed on the second surface 310b thereof. The first and second conductive patterns 312, 313 may be formed through the use of a photolithography process, though the present invention is not intended to be limited to any particular method of forming the first and second conductive patterns 312, 313. The conductive vias 314 used to electrically connect the first and second conductive patterns 312, 313 to each other may be formed by the creation of via holes (not shown) in the insulative layer 311 through the use of a laser drill or an etching process, such via holes subsequently being filled or lined with a metal material so as to form the conductive vias 314. It is contemplated that the first and second conductive patterns 312, 313 and conductive vias 314 may each be formed of a metal material, such as copper, though the present invention is not intended to be limited to any specific materials in relation thereto. The above-described first and second solder masks 315, 316 which cover predetermined regions of respective ones of the first and second conductive patterns 312, 313 may be formed through a process of exposing and developing a thermosetting resin or a UV curable resin, though the present invention is also not intended to be limited to any particular method for forming the first and second solder masks 315, 316. As indicated above, the substrate 310 may comprise a general, rigid printed circuit board or an equivalent material. Additionally, though in FIG. 9A one insulative layer 311 is shown as being included in the substrate 310, a plurality of insulative layers 311 may be laminated to each other in a strip shape or in a matrix to form the substrate 310.

Figure 9B:
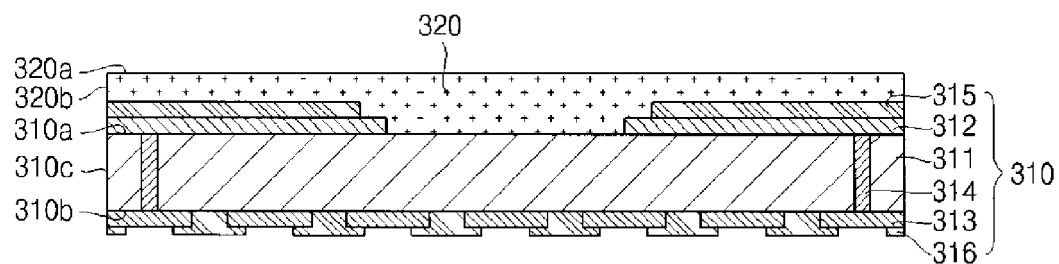

In the next step of the fabrication process for the semiconductor package 300 as shown in FIG. 9B, the first patterning layer 320 is formed on the substrate 310 in the configuration described above in relation to FIG. 4. In this regard, the first patterning layer 320 is formed by applying the material used to fabricate the same to the exposed portion of the first surface 310a of the insulative layer 311, the exposed portion of the first conductive pattern 312 other than for the outer end thereof, and the exposed portion of the first solder mask 315 other than for the outer end thereof. Subsequent to such application, the first patterning layer 320 is hardened through the use of heat. The first patterning layer 320 may be attached to the substrate 310 through the use of a semiconductor die bonding device or a specially developed device. In hardening the first patterning layer 320, heat in the temperature range of about 130° C. to about 150° C. is applied thereto in an oven.

Figure 9C:
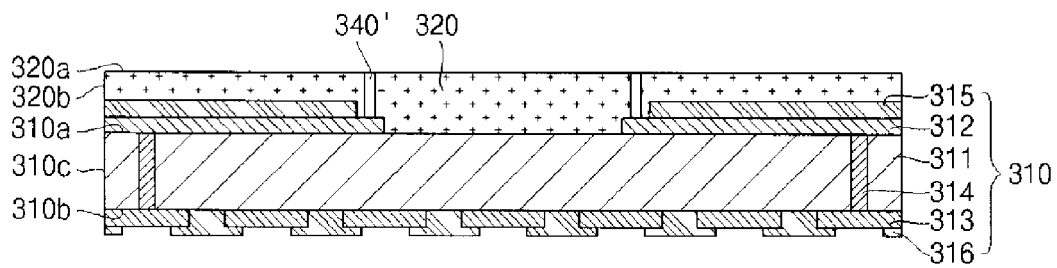
Figure 9C:
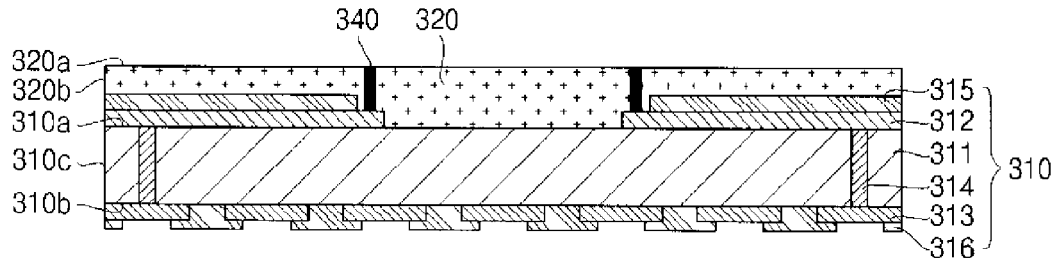

In the next step of the fabrication process for the semiconductor package 300 as shown in FIG. 9C, the above-described first wiring pattern 340 is formed in the first patterning layer 320. To facilitate the formation of the first wiring pattern 340, via patterning holes 340' are initially formed in the first patterning layer 320, such via patterning holes 340' extending generally perpendicularly between the first surface 320a of the first patterning layer 320 and respective prescribed portions of the first conductive pattern 312. Each patterning hole 340' may be formed by milling using a micro-drilling or laser processing method, though the present invention is not intended to be limited to any specific method for forming any patterning hole 340' within the first patterning layer 320. Subsequent to the formation of the patterning hole(s) 340', a conductive material in the form of ink or paste is injected into such patterning hole(s) 340', thus forming the first wiring pattern 340 which is electrically connected to the first conductive pattern 312. In the semiconductor package 300, it is contemplated that the injected conductive material may include gold, silver, copper, aluminum or an equivalent material thereto, the present invention not being limited to any particular material for use in fabricating the first wiring pattern 340. Additionally, the injection of the conductive material into the patterning hole(s) 340' to facilitate the formation of the first wiring pattern 340 may be accomplished through the use of screen printing, writing, plating, or an equivalent technique, the present invention also not being limited to any particular injection method. After the conductive material is injected into the patterning hole(s) 340', the first wiring pattern 340 is cured by the application of heat to the first patterning layer 320 in a temperature range of about 150° C. to about 200° C.

Figure 9D:
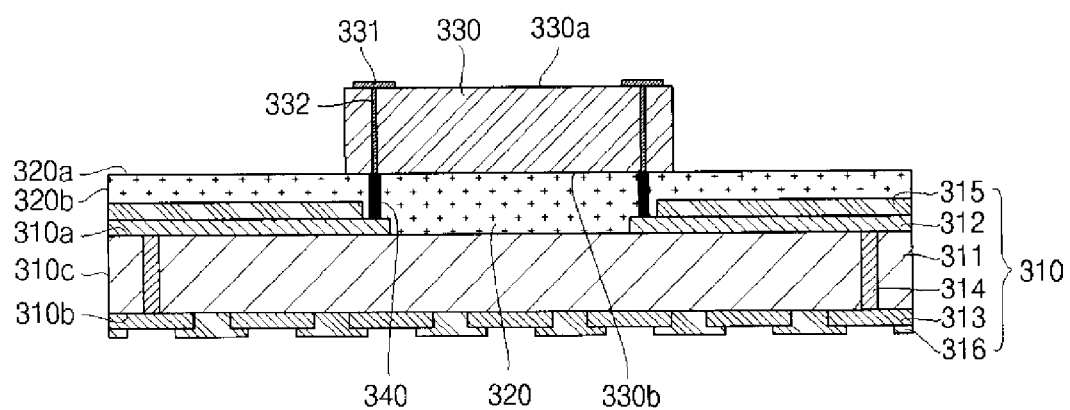

In the next step of the fabrication process for the semiconductor package 300 as shown in FIG. 9D, the first semiconductor die 120 is attached to the first surface 320a of the first patterning layer 320 and electrically connected to the first wiring pattern 340. As indicated above, such electrical connection is preferably facilitated by aligning and electrically connecting the lower ends of the vias 332 of the first semiconductor die 330 to respective segments of the first wiring pattern 340 in the manner shown in FIG. 9D.

Figure 9E:
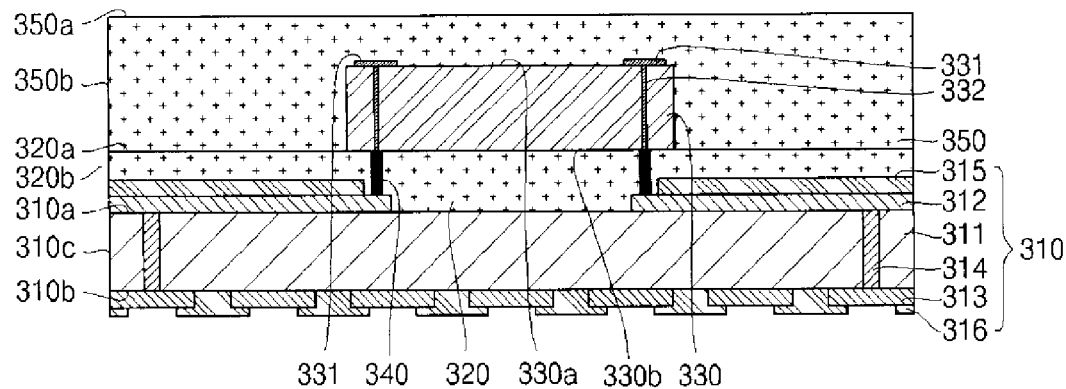

In the next step of the fabrication process for the semiconductor package 300 as shown in FIG. 9E, the second patterning layer 350 is formed on the first patterning layer 320 and the first semiconductor die 330 in the size and configuration described above in relation to FIG. 4. In this regard, the second patterning layer 350 is formed by applying the material used to fabricate the same to the first semiconductor die 330 and to the exposed portion of the first surface 320a of the first patterning layer 320. Subsequent to such application, the second patterning layer 350 is hardened through the use of heat. In hardening the second patterning layer 350, heat in the temperature range of about 130° C. to about 150° C. is applied thereto in an oven.

Figure 9F:
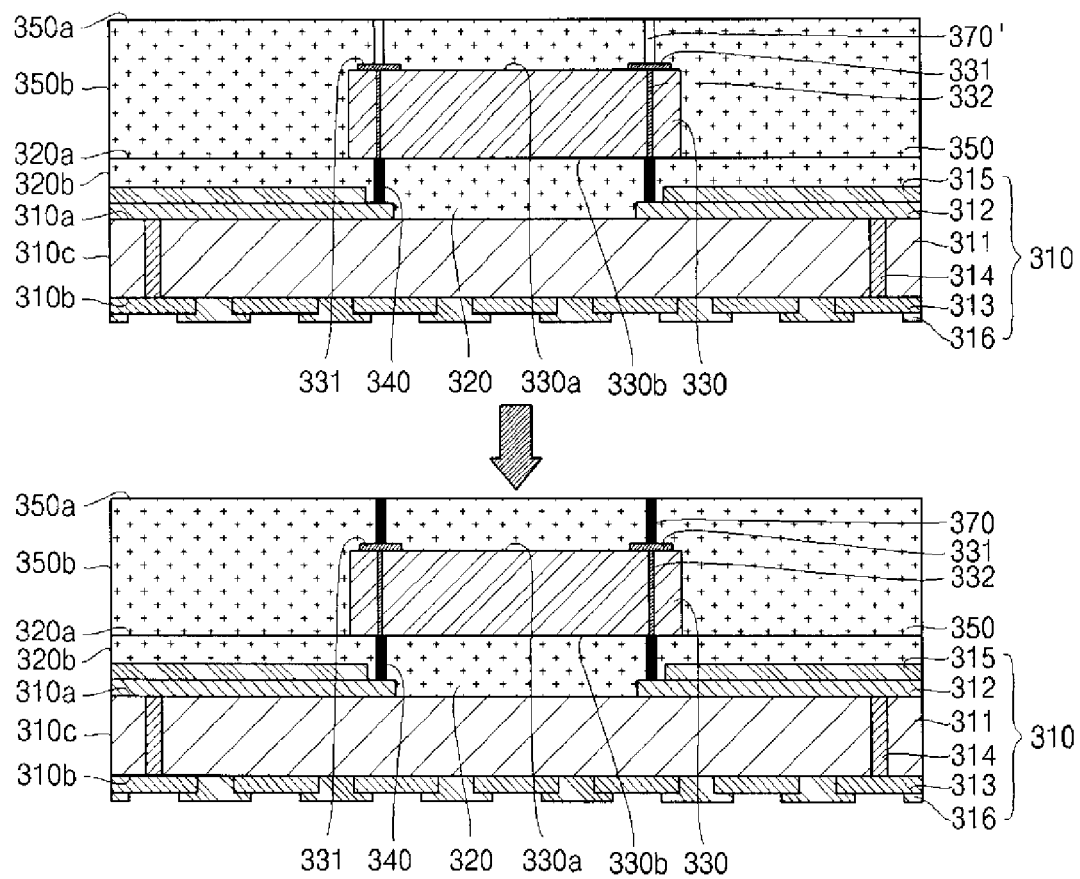

In the next step of the fabrication process for the semiconductor package 300 as shown in FIG. 9F, the above-described second wiring pattern 370 is formed in the second patterning layer 350. To facilitate the formation of the second wiring pattern 370, via patterning holes 370' are initially formed in the second patterning layer 350, such via patterning holes 370' extending generally perpendicularly between the first surface 350a of the second patterning layer 350 and respective ones of the bonding pads 331 of the first semiconductor die 330. Each patterning hole 370' may be formed by milling using a micro-drilling or laser processing method, though the present invention is not intended to be limited to any specific method for forming any patterning hole 370' within the second patterning layer 350. Subsequent to the formation of the patterning hole(s) 370', a conductive material in the form of ink or paste is injected into such patterning hole(s) 370', thus forming the second wiring pattern 370 which is electrically connected to the first semiconductor die 330. In the semiconductor package 300, it is contemplated that the injected conductive material may include gold, silver, copper, aluminum or an equivalent material thereto, the present invention not being limited to any particular material for use in fabricating the second wiring pattern 370. Additionally, the injection of the conductive material into the patterning hole(s) 370' to facilitate the formation of the second wiring pattern 370 may be accomplished through the use of screen printing, writing, plating, or an equivalent technique, the present invention also not being limited to any particular injection method. After the conductive material is injected into the patterning hole(s) 370', the second wiring pattern 370 is cured by the application of heat to the second patterning layer 350 in a temperature range of about 150° C. to about 200° C.

Figure 9G:
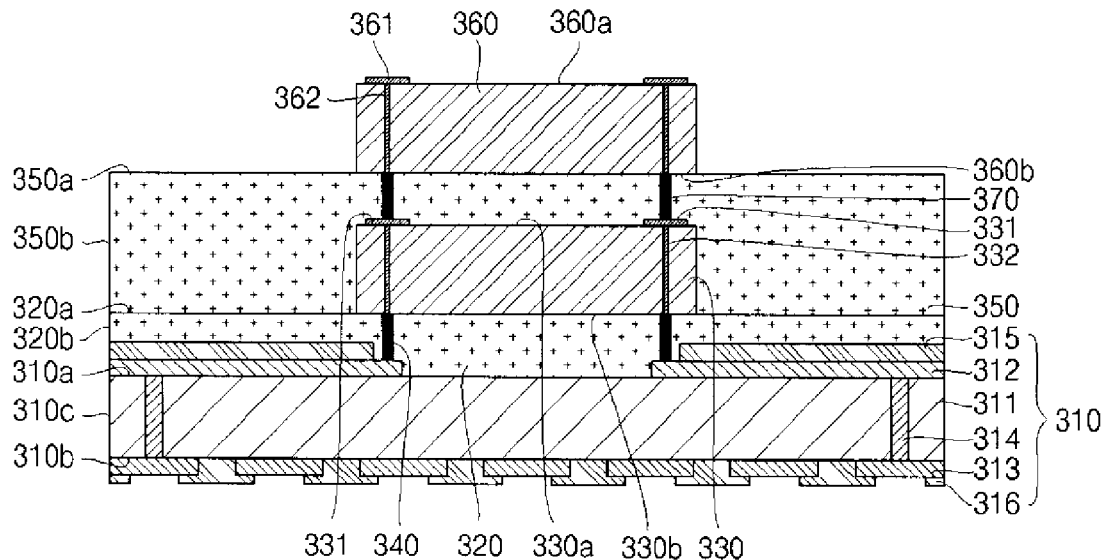

In the next step of the fabrication process for the semiconductor package 300 as shown in FIG. 9G, the second semiconductor die 360 is attached to the first surface 350a of the second patterning layer 350 and electrically connected to the second wiring pattern 370. As indicated above, such electrical connection is preferably facilitated by aligning and electrically connecting the lower ends of the vias 362 of the second semiconductor die 360 to respective segments of the second wiring pattern 370 in the manner shown in FIG. 9G.

Figure 9H:
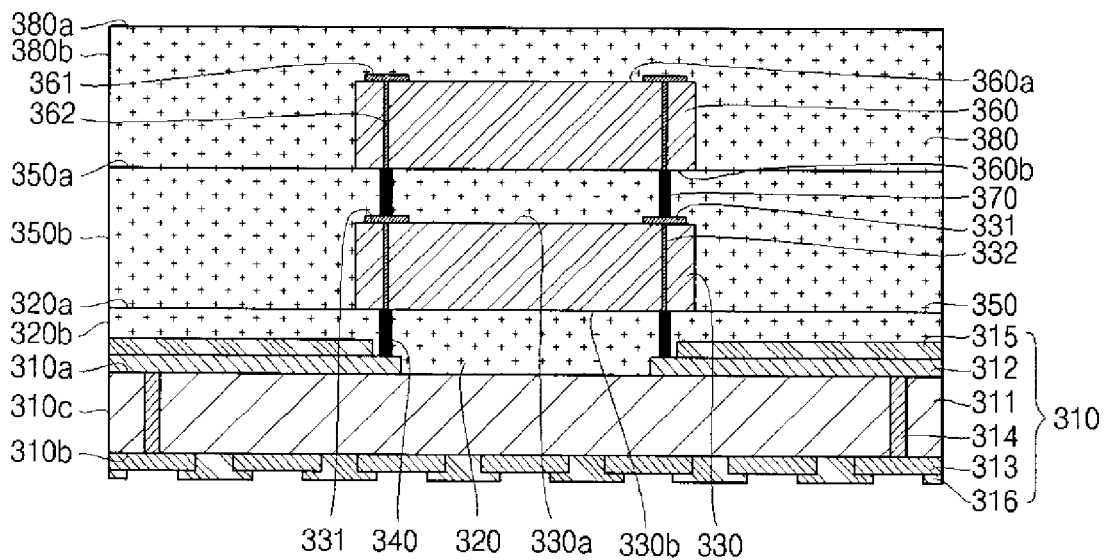

In the next step of the fabrication process for the semiconductor package 300 as shown in FIG. 9H, the third patterning layer 380 is formed on the second patterning layer 350 and the second semiconductor die 360 in the size and configuration described above in relation to FIG. 4. In this regard, the third patterning layer 380 is formed by applying the material used to fabricate the same to the second semiconductor die 360 and to the exposed portion of the first surface 350a of the second patterning layer 350. Subsequent to such application, the third patterning layer 380 is hardened through the use of heat. In hardening the third patterning layer 380, heat in the temperature range of about 130° C. to about 150° C. is applied thereto in an oven.

Figure 9I:
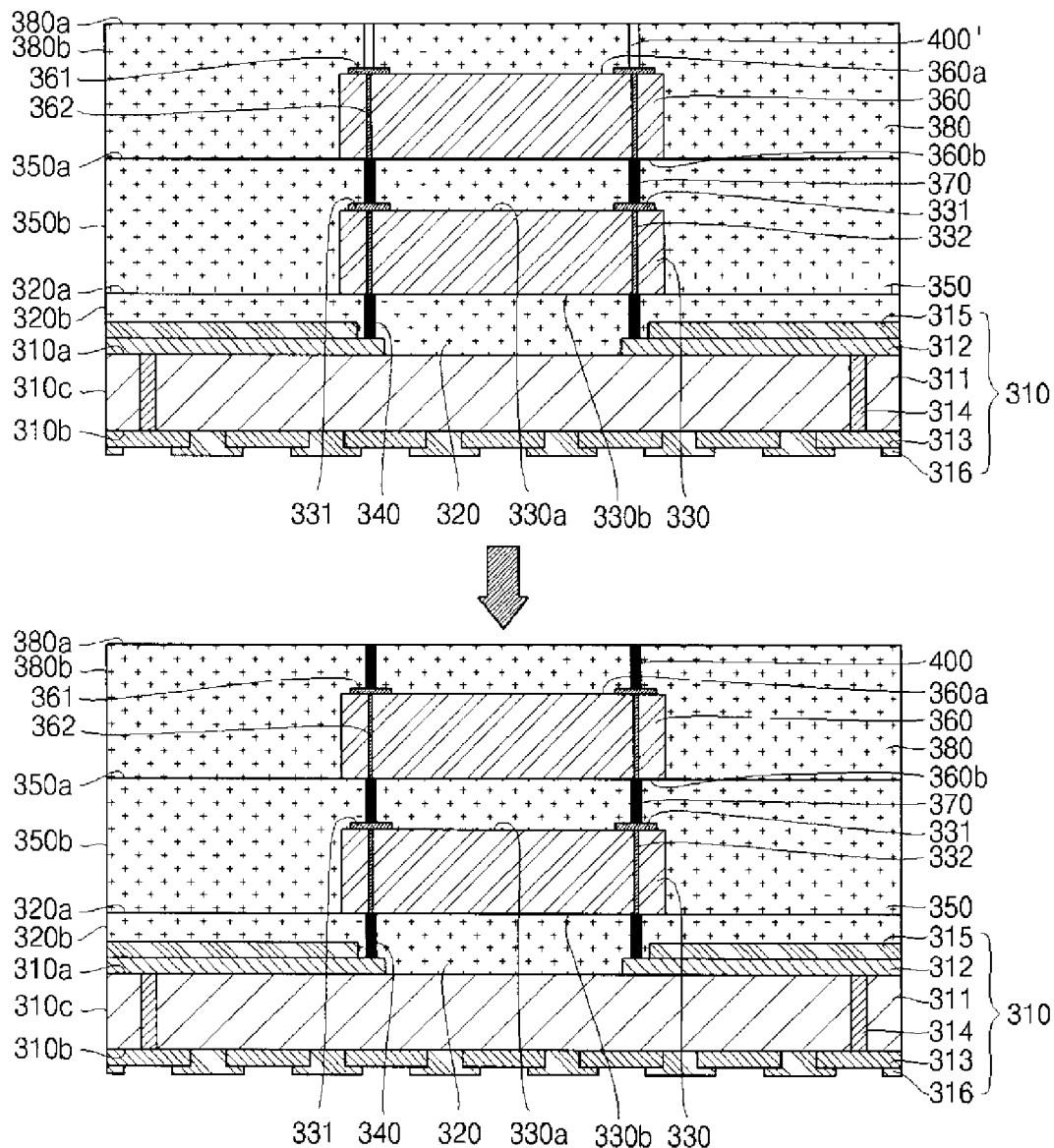

In the next step of the fabrication process for the semiconductor package 300 as shown in FIG. 9I, the above-described third wiring pattern 400 is formed in the third patterning layer 380. To facilitate the formation of the third wiring pattern 400, via patterning holes 400' are initially formed in the third patterning layer 380, such via patterning holes 400' extending generally perpendicularly between the first surface 380a of the third patterning layer 380 and respective ones of the bonding pads 361 of the second semiconductor die 360. Each patterning hole 400' may be formed by milling using a microdrilling or laser processing method, though the present invention is not intended to be limited to any specific method for forming any patterning hole 400' within the third patterning layer 380. Subsequent to the formation of the patterning hole(s) 400', a conductive material in the form of ink or paste is injected into such patterning hole(s) 400', thus forming the third wiring pattern 400 which is electrically connected to the second semiconductor die 360. In the semiconductor package 300, it is contemplated that the injected conductive material may include gold, silver, copper, aluminum or an equivalent material thereto, the present invention not being limited to any particular material for use in fabricating the third wiring pattern 400. Additionally, the injection of the conductive material into the patterning hole(s) 400' to facilitate the formation of the third wiring pattern 400 may be accomplished through the use of screen printing, writing, plating, or an equivalent technique, the present invention also not being limited to any particular injection method. After the conductive material is injected into the patterning hole(s) 400', the third wiring pattern 400 is cured by the application of heat to the third patterning layer 380 in a temperature range of about 150° C. to about 200° C.

Figure 9J:
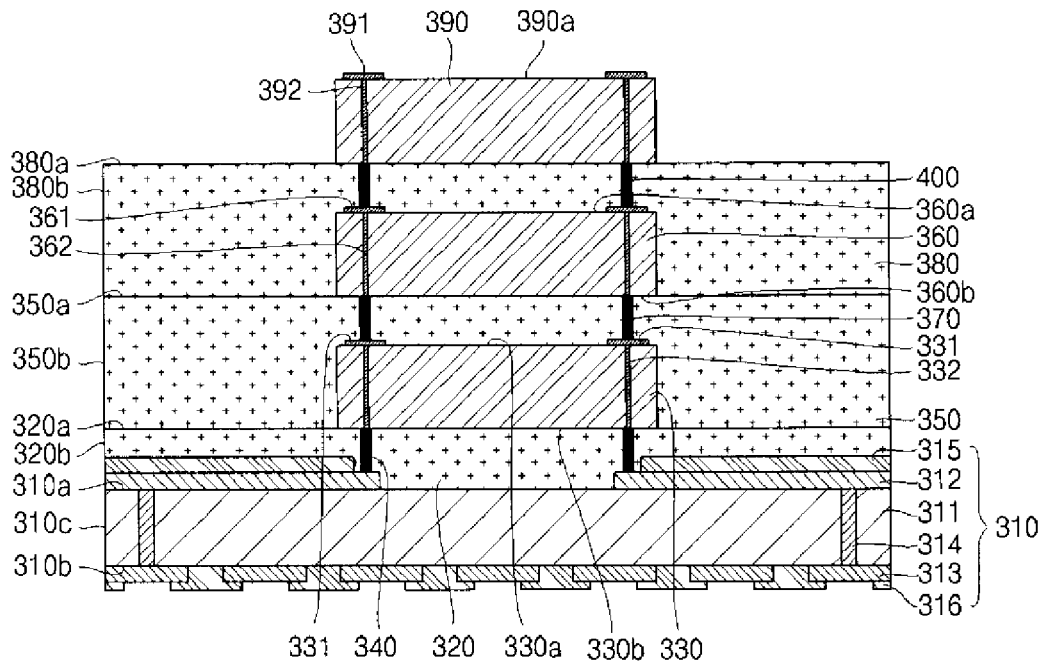

In the next step of the fabrication process for the semiconductor package 300 as shown in FIG. 9J, the third semiconductor die 390 is attached to the first surface 380a of the third patterning layer 380 and electrically connected to the third wiring pattern 400. As indicated above, such electrical connection is preferably facilitated by aligning and electrically connecting the lower ends of the vias 392 of the third semiconductor die 390 to respective segments of the third wiring pattern 400 in the manner shown in FIG. 9J.

Figure 9K:
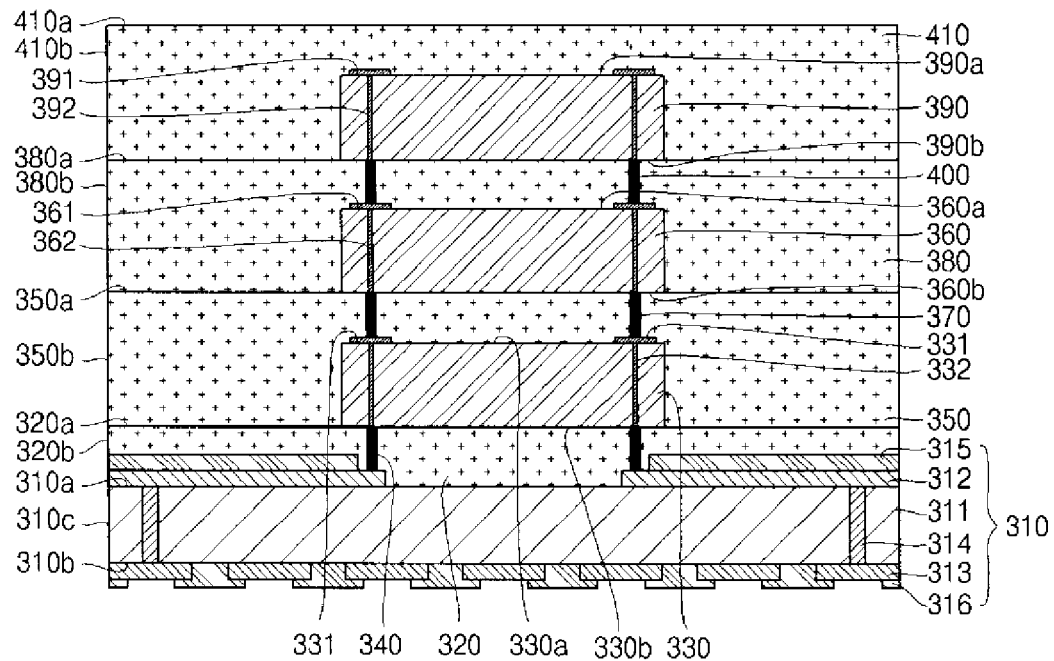

In the next step of the fabrication process for the semiconductor package 300 as shown in FIG. 9K, the fourth patterning layer 410 is formed on the third patterning layer 380 and the third semiconductor die 390 in the size and configuration described above in relation to FIG. 4. In this regard, the fourth patterning layer 410 is formed by applying the material used to fabricate the same to the third semiconductor die 390 and to the exposed portion of the first surface 380a of the third patterning layer 380. Subsequent to such application, the fourth patterning layer 410 is hardened through the use of heat. In hardening the fourth patterning layer 410, heat in the temperature range of about 130° C. to about 150° C. is applied thereto in an oven.

Figure 9L:
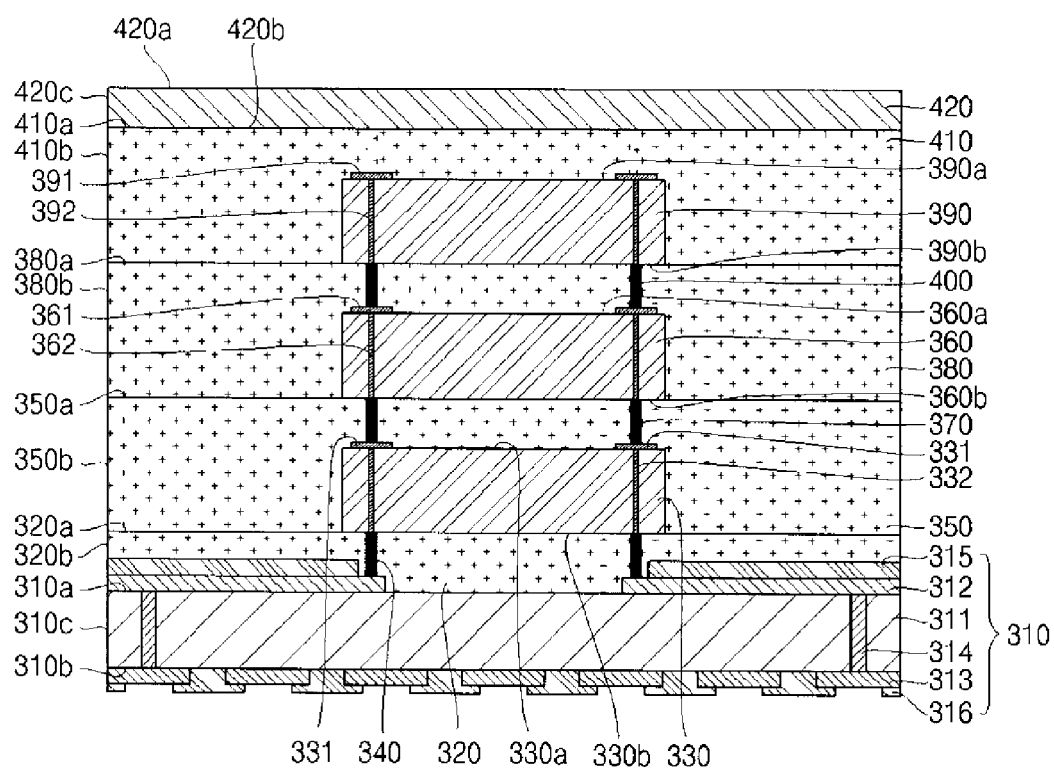

In the next step of the fabrication method for the semiconductor package 300 as shown in FIG. 9L, the protective layer 420 is formed on the fourth patterning layer 410 so as to cover the first surface 410a thereof. It is contemplated that the protective layer 420 may be formed by the same method used to form the first, second, third and fourth patterning layers 320, 350, 380, 410. As indicated above, the protective layer 420 covers the first surface 410a of the fourth patterning layer 410 so as to prevent the fourth patterning layer 410 from being damaged or oxidized by external agents.

Figure 9M:
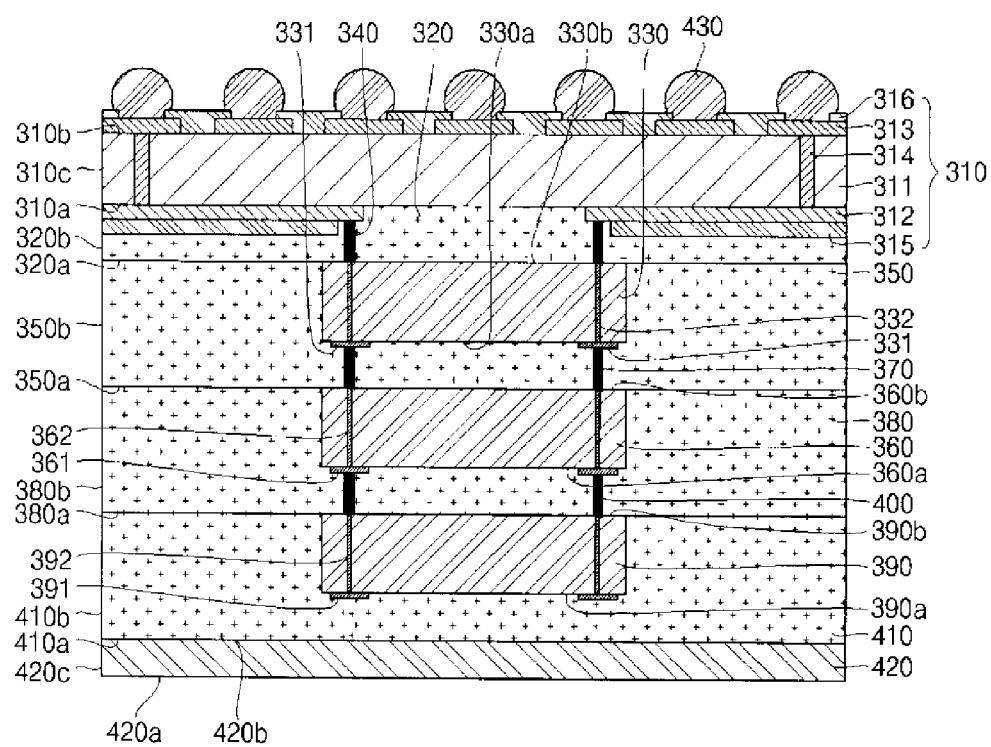

In the final step of the fabrication process for the semiconductor package 300 as shown in FIG. 9M, the solder balls 430 are mounted and electrically connected to the second conductive pattern 313 of the substrate 310. The mounting of the solder balls 430 to the second conductive pattern 313 includes the initial application of flux to exposed surface portions of the conductive pattern 313. Thereafter, the solder balls 430 are mounted to respective portions of the second conductive pattern 313 which have the flux applied thereto, with a reflowing and subsequent cooling procedure being implemented to complete the formation of the solder balls 430 and the electrical connection thereof to the second conductive pattern 313. The flux applied to the second conductive pattern 313 may have a viscosity so as to improve the adhesive property of the solder balls 430. Further, it is contemplated that the flux will be volatile so that it is mostly volatized in the reflowing step described above. Those of ordinary skill in the art will recognize that a manufacturing process similar to that described above in relation to the semiconductor package 300 may be implemented to facilitate the fabrication of a semiconductor package which is similar to the semiconductor package 300 but includes fewer of greater than the three semiconductor dies 330, 360, 390 described in relation to the semiconductor package 300.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor package, comprising:
   a substrate including an insulative layer defining opposed first and second surfaces and having a first conductive pattern disposed on the first surface and a second conductive pattern disposed on the second surface and electrically connected to the first conductive pattern;
   at least one semiconductor die mounted to the insulative layer and electrically connected to the first conductive pattern thereof;
   a patterning layer defining a first surface, the patterning layer at least partially encapsulating the semiconductor die and at least partially covering the first conductive pattern and the first surface of the insulative layer, the second conductive pattern not being covered by the patterning layer; and
   a wiring pattern embedded in the patterning layer and electrically connecting the semiconductor die to the first conductive pattern of the substrate, a portion of the wiring pattern being exposed in and substantially flush with the first surface of the patterning layer.

2. The semiconductor package of claim 1 further comprising a protective layer formed on the patterning layer and covering the portion of the wiring pattern exposed in the first surface thereof.

3. The semiconductor package of claim 1 wherein portions of the first and second conductive patterns are each covered by a solder mask.

4. The semiconductor package of claim 1 wherein the second conductive pattern includes a plurality of solder balls electrically connected thereto in a prescribed arrangement.

5. The semiconductor package of claim 1 wherein the wiring pattern comprises:
a first via pattern in electrical communication with the semiconductor die;
a second via pattern in electrical communication with the first conductive pattern; and
a connection pattern electrically connected to and extending between the first and second via patterns.

6. The semiconductor package of claim 5 wherein the connection pattern of the wiring pattern in exposed in and substantially flush with the first surface of the patterning layer.

7. A semiconductor package, comprising:
a substrate including an insulative layer defining opposed first and second surfaces and having a conductive pattern disposed on each of the first and second surfaces, the conductive patterns being electrically connected to each other in a prescribed manner;
a first patterning layer defining a first surface, the first patterning layer at least partially covering the first surface of the insulative layer and the conductive pattern disposed thereon, the conductive pattern disposed on the second surface of the insulative layer not being covered by the first patterning layer;
a first wiring pattern embedded in the first patterning layer and electrically connected to the conductive pattern disposed on the first surface of the insulating layer, a portion of the first wiring pattern being exposed in and substantially flush with the first surface of the first patterning layer; and
a first semiconductor die electrically connected to the first wiring pattern.

8. The semiconductor package of claim 7 wherein the first semiconductor die is at least partially encapsulated by the first patterning layer and electrically connected to the conductive pattern disposed on the first surface of the insulative layer by the first wiring pattern.

9. The semiconductor package of claim 8, further comprising:
a second semiconductor die electrically connected to the conductive pattern disposed on the first surface of the insulative layer;
a second patterning layer defining a first surface, the second patterning layer at least partially encapsulating the second semiconductor die and the first patterning layer; and
a second wiring pattern embedded in the second patterning layer and electrically connecting the second semiconductor die to the conductive pattern disposed on the first surface of the insulative layer, a portion of the second wiring pattern being exposed in and substantially flush with the first surface of the second patterning layer.

10. The semiconductor package of claim 9 further comprising a protective layer formed on the first surface of the second patterning layer and covering the portion of the second wiring pattern exposed therein.

11. The semiconductor package of claim 10 wherein the second patterning layer is sized and configured to cover the portion of the first wiring pattern exposed in the first surface of the first patterning layer.

12. The semiconductor package of claim 9 wherein the substrate further comprises:
a first conductive pattern disposed on the first surface;
a second conductive pattern disposed on the first surface;
a third conductive pattern disposed on the second surface and electrically connected to the first conductive pattern; and
a fourth conductive pattern disposed on the second surface and electrically connected to the second conductive pattern;
the first semiconductor die being electrically connected to the first conductive pattern, with the second semiconductor die being electrically connected to the second conductive pattern and the first patterning layer covering the first semiconductor die and at least portions of the first conductive pattern, the second conductive pattern and the first surface of the insulative layer, and not covering the third and fourth conductive patterns.

13. The semiconductor package of claim 12 wherein the third and fourth conductive patterns each include a plurality of solder balls electrically connected thereto in a prescribed arrangement.

14. The semiconductor package of claim 12 wherein the first wiring pattern comprises:
a first via pattern in electrical communication with the first semiconductor die;
a second via pattern in electrical communication with the first conductive pattern; and
a connection pattern electrically connected to and extending between the first and second via patterns.

15. The semiconductor package of claim 14 wherein the connection pattern of the first wiring pattern in exposed in and substantially flush with the first surface of the first patterning layer.

16. The semiconductor package of claim 14 wherein the second wiring pattern comprises:
a first via pattern in electrical communication with the second semiconductor die;
a second via pattern in electrical communication with the second conductive pattern; and
a connection pattern electrically connected to and extending between the first and second via patterns.

17. The semiconductor package of claim 16 wherein the connection pattern of the second wiring pattern is exposed in and substantially flush with the first surface of the second patterning layer.

18. The semiconductor package of claim 7, further comprising:
a second patterning layer defining a first surface, the second patterning layer at least partially encapsulating the first semiconductor die and the first patterning layer;
a second wiring pattern embedded in the second patterning layer and electrically connected to the first semiconductor die, a portion of the second wiring pattern being exposed in and substantially flush with the first surface of the second patterning layer;
a second semiconductor die electrically connected to the second wiring pattern; and
a third patterning layer defining a first surface, the third patterning layer at least partially encapsulating the second semiconductor die and the second patterning layer.

19. The semiconductor package of claim 18, further comprising:
a third wiring pattern embedded in the third patterning layer and electrically connected to the second semiconductor die, a portion of the third wiring pattern being exposed in and substantially flush with the first surface of the third patterning layer;
a third semiconductor die electrically connected to the third wiring pattern; and
a fourth patterning layer at least partially encapsulating the third semiconductor die and the third patterning layer.

* * * * *